US012394462B2

(12) United States Patent
Hashemi et al.

(10) Patent No.: US 12,394,462 B2
(45) Date of Patent: Aug. 19, 2025

(54) STACKED FET WITH THREE-TERMINAL SOT MRAM

(71) Applicant: INTERNATIONAL BUSINESS MACHINES CORPORATION, Armonk, NY (US)

(72) Inventors: Pouya Hashemi, Purchase, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 17/935,966

(22) Filed: Sep. 28, 2022

(65) Prior Publication Data

US 2024/0105244 A1    Mar. 28, 2024

(51) Int. Cl.
*G11C 11/16*    (2006.01)
*G11C 11/18*    (2006.01)
*H10B 61/00*    (2023.01)
*H10N 50/01*    (2023.01)
(Continued)

(52) U.S. Cl.
CPC ........ *G11C 11/161* (2013.01); *G11C 11/1673* (2013.01); *G11C 11/1675* (2013.01); *H10B 61/22* (2023.02); *H10N 50/01* (2023.02); *H10N 50/10* (2023.02); *H10N 50/80* (2023.02)

(58) Field of Classification Search
CPC ............. G11C 11/161; G11C 11/1673; G11C 11/1675; G11C 11/1659; H10B 61/22; H10N 50/01; H10N 50/10; H10N 50/80
See application file for complete search history.

(56) References Cited

U.S. PATENT DOCUMENTS

| 7,170,272 B2 | 1/2007 | Yoshida |
| 9,673,802 B2 | 6/2017 | Granger-Jones et al. |
| 9,729,107 B2 | 8/2017 | Nobbe et al. |

(Continued)

FOREIGN PATENT DOCUMENTS

| CN | 110875425 A | 3/2020 |
| CN | 111542490 A | 8/2020 |

(Continued)

OTHER PUBLICATIONS

International Application No. PCTCN2023/118194, Notification of Transmittal of the International Search Report and the Written Opinion, mailed Nov. 29, 2023, 9 pgs.

(Continued)

*Primary Examiner* — Hien N Nguyen
(74) *Attorney, Agent, or Firm* — Matthew Zehrer

(57) ABSTRACT

Embodiments are disclosed for a three-terminal spin-orbit-torque (SOT) magnetoresistive random access memory (MRAM) device. The three-terminal SOT MRAM device includes a first type field effect transistor (FET) that drives an SOT line. Additionally, the first type FET includes a write gate in electrical contact with a write wordline (WWL). Further, the device also includes a second type FET in electrical contact with a magnetic tunnel junction (MTJ). Also, the second type FET comprises a read gate in electrical contact with a read wordline (RWL). Additionally, the first type FET is disposed above the second type FET. Further, the three-terminal SOT MRAM device provides a density of three contacted poly pitch (CPP) per two cells.

20 Claims, 18 Drawing Sheets

(51) Int. Cl.
   *H10N 50/10*   (2023.01)
   *H10N 50/80*   (2023.01)

(56) References Cited

U.S. PATENT DOCUMENTS

| | | | |
|---|---|---|---|
| 10,236,292 | B1 | 3/2019 | Frougier |
| 10,388,519 | B2 | 8/2019 | Smith |
| 10,726,892 | B2 | 7/2020 | Le |
| 10,734,384 | B1 | 8/2020 | Li |
| 10,916,284 | B2 | 2/2021 | Le |
| 11,127,896 | B2 | 9/2021 | Alam |
| 11,165,012 | B2 | 11/2021 | Ying |
| 11,227,922 | B2 | 1/2022 | Li |
| 11,251,304 | B2 | 2/2022 | Wang |
| 11,264,274 | B2 | 3/2022 | Smith |
| 11,289,484 | B2 | 3/2022 | Zhang |
| 11,514,963 | B2 | 11/2022 | Drouard |
| 11,594,575 | B2 | 2/2023 | Lin |
| 2008/0023728 | A1* | 1/2008 | Jang ............. H10B 10/125 257/E27.111 |
| 2019/0189195 | A1* | 6/2019 | Na ............. H10D 84/834 |
| 2020/0350364 | A1* | 11/2020 | Wan ............. H10B 61/22 |
| 2021/0184105 | A1* | 6/2021 | Sasaki ............. H10N 52/80 |
| 2022/0148635 | A1 | 5/2022 | Yogendra |
| 2022/0208244 | A1* | 6/2022 | Song ............. G11C 11/18 |
| 2022/0223787 | A1 | 7/2022 | Pinarbasi |
| 2022/0359613 | A1* | 11/2022 | Lin ............. H10N 50/80 |

FOREIGN PATENT DOCUMENTS

| | | |
|---|---|---|
| CN | 113160863 A | 7/2021 |
| CN | 108463948 B | 12/2021 |
| CN | 119949036 A | 5/2025 |
| KR | 10-2228497 B1 | 3/2021 |
| TW | I652797 B | 3/2019 |
| TW | I731138 B | 6/2021 |
| WO | 2024/067059 A1 | 4/2024 |

OTHER PUBLICATIONS

Seo et al.;, "Area Optimization Techniques for High-Density Spin-Orbit Torque MRAMs", MDPI-Electronics, Mar. 26, 2021, 11 Pgs, <https://doi.org/10.3390/electronics10070792>.

Seo et al. "Area-Efficient SOT-MRAM With a Schottky Diode", IEEE Electron Device Letters, Aug. 2016, pp. 982-985, vol. 37, Issue: 8.

* cited by examiner

STACKED FET WITH THREE-TERMINAL SOT MRAM

BACKGROUND

The present disclosure relates to a stacked field effect transistor (FET), and more specifically, to a stacked FET with three-terminal spin-orbit torque (SOT) magnetoresistive random access memory (MRAM).

Integrated circuits, such as microprocessors, may have a relatively large number of circuit elements, such as transistors, which are disposed in a limited chip area. The transistors can be n-type metal-oxide semiconductor field-effect transistors (nFET) or p-type metal-oxide semiconductor FET (pFET) type devices wherein the "N" and "P" designation depends on the type of dopants used in creating the source/drain regions of the devices. Complementary metal oxide semiconductor (CMOS) technology refers to integrated circuit products that use both n-type and p-type transistor devices.

Additionally, a CMOS device can include stacked FETs, which may be electrically connected, and/or isolated. Further, stacked FET CMOS devices may be useful for many applications, from memory to computer processors. Memory may include read-only memory (ROM) and random access memory (RAM), for example. More specifically, RAM can include MRAM, such as, three-terminal SOT MRAM.

Three-terminal SOT MRAM can provide a separable read and write path as well as allowing to switch at sub 1 nanosecond (ns) regime using a different write mechanism, such as spin-orbit coupling. However, SOT MRAM may use two transistors, e.g., FETs, per cell for read and write operations, which increases a density penalty over other configurations, such as the one transistor per resistive RAM (RRAM) magnetic tunnel junction (1T/1R MTJ), which uses one transistor per cell. In SOT MRAM, one cell takes three transistor gate pitch (also referred to as contacted poly pitch (CPP)) in the X direction and two fins (or, two nanosheet devices) in the Y direction with merged epitaxial layers (epis). Alternatively, the SOT MRAM can include a relatively wide nanosheet, which may not be practical to implement.

SUMMARY

Embodiments are disclosed for a three-terminal spin-orbit-torque (SOT) magnetoresistive random access memory (MRAM) device. The three-terminal SOT MRAM device includes a first type field effect transistor (FET) that drives an SOT line. Additionally, the first type FET includes a write gate in electrical contact with a write wordline (WWL). Further, the device also includes a second type FET in electrical contact with a magnetic tunnel junction (MTJ). Also, the second type FET comprises a read gate in electrical contact with a read wordline (RWL). Additionally, the first type FET is disposed above the second type FET. Further, the three-terminal SOT MRAM device provides a density of three contacted poly pitch (CPP) per two cells. Advantageously, such embodiments improve the density of three-terminal SOT MRAM arrays.

Embodiments are disclosed for a three-terminal SOT MRAM device. The three-terminal SOT MRAM device includes an NFET that drives an SOT line. Additionally, the NFET includes a write gate in electrical contact with a WWL. Further, the three-terminal SOT MRAM device includes a PFET in electrical contact with an MTJ. Additionally, the PFET includes a read gate in electrical contact with an RWL. Further, the PFET is disposed above the NFET. Advantageously, such embodiments improve the density of three-terminal SOT MRAM arrays.

Embodiments are disclosed for a three-terminal SOT MRAM device. The three-terminal SOT MRAM device includes a PFET that drives an SOT line. Additionally, the PFET includes a write gate in electrical contact with a WWL. Further, the three-terminal SOT MRAM device includes an NFET in electrical contact with an MTJ. Additionally, the NFET includes a read gate in electrical contact with an RWL. Further, the NFET is disposed above the PFET. Advantageously, such embodiments improve the density of three-terminal SOT MRAM arrays.

Embodiments are disclosed for a method for fabricating a three-terminal SOT MRAM device. The method includes forming a bottom dummy gate on an isolation layer in contact with a substrate. The method also includes forming a bottom source/drain epitaxy (S/D epi). Additionally, the method includes performing an ILD deposit on the dummy gate and bottom S/D epi. Further, the method includes performing a chemical mechanical planarization to remove a gate hard mask of the bottom dummy gate and spacers in contact with the gate hard mask. Additionally, the method includes forming a bottom S/D sacrificial contact in contact with the bottom S/D epi. Also, the method includes forming a bonding oxide disposed above a bottom layer including the bottom dummy gate. Further, the method includes bonding the bonding oxide to nanosheet channels of a top layer. The top layer includes sacrificial nanosheet layers in contact with the nanosheet channels. Additionally, the method includes performing active device patterning on the top layer. Further, the method includes forming a top dummy gate of the top layer. Also, the method includes forming spacers for the top layer. Additionally, the method includes forming a top S/D epi for the top layer. Also, the method includes depositing ILD for the top layer. Further, the method includes performing CMP to remove a hard mask of the top layer and spacers of the top layer. Additionally, the method includes forming a gate opening mask. Also, the method includes removing the top dummy gate and the bottom dummy gate. Further, the method includes performing an SiGe release. Additionally, the method includes removing the sacrificial nanosheet layers. Also, the method includes forming a replacement gate for the top layer and bottom layer. Further, the method includes forming gate cuts that provide access to the top S/D epi and the bottom S/D epi. Additionally, the method includes forming middle of line (MOL) contacts. Also, the method includes removing the bottom S/D sacrificial contact. Further, the method includes forming contact metallization using the gate cuts. Additionally, the method includes forming back end of line (BEOL) connections. Advantageously, such embodiments improve the density of three-terminal SOT MRAM arrays.

Embodiments are disclosed for a computer program product including program instructions stored on a computer readable storage medium. The program instructions are executable by a processor to cause the processor to perform a method for fabricating a three-terminal SOT MRAM device. The method includes forming a bottom dummy gate on an isolation layer in contact with a substrate. The method also includes forming a bottom source/drain epitaxy (S/D epi). Additionally, the method includes performing an ILD deposit on the dummy gate and bottom S/D epi. Further, the method includes performing a chemical mechanical planarization to remove a gate hard mask of the bottom dummy gate and spacers in contact with the gate hard mask' Additionally, the method includes forming a bottom S/D sacrificial contact in contact with the bottom S/D epi. Also, the method includes forming a bonding oxide disposed above a bottom layer including the bottom dummy gate. Further, the method includes bonding the bonding oxide to nanosheet channels of a top layer. The top layer includes sacrificial nanosheet layers in contact with the nanosheet channels. Additionally, the method includes performing active device patterning on the top layer. Further, the method includes forming a top dummy gate of the top layer. Also, the method includes forming spacers for the top layer. Additionally, the method includes forming a top S/D epi for the top layer. Also, the method includes depositing ILD for the top layer. Further, the method includes performing CMP to remove a hard mask of the top layer and spacers of the top layer. Additionally, the method includes forming a gate opening mask. Also, the method includes removing the top dummy gate and the bottom dummy gate. Further, the method includes performing an SiGe release. Additionally, the method includes removing the sacrificial nanosheet layers. Also, the method includes forming a replacement gate for the top layer and bottom layer. Further, the method includes forming gate cuts that provide access to the top S/D epi and the bottom S/D epi. Additionally, the method includes forming middle of line (MOL) contacts. Also, the method includes removing the bottom S/D sacrificial contact. Further, the method includes forming contact metallization using the gate cuts. Additionally, the method includes forming back end of line (BEOL) connections. Advantageously, such embodiments improve the density of three-terminal SOT MRAM arrays.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
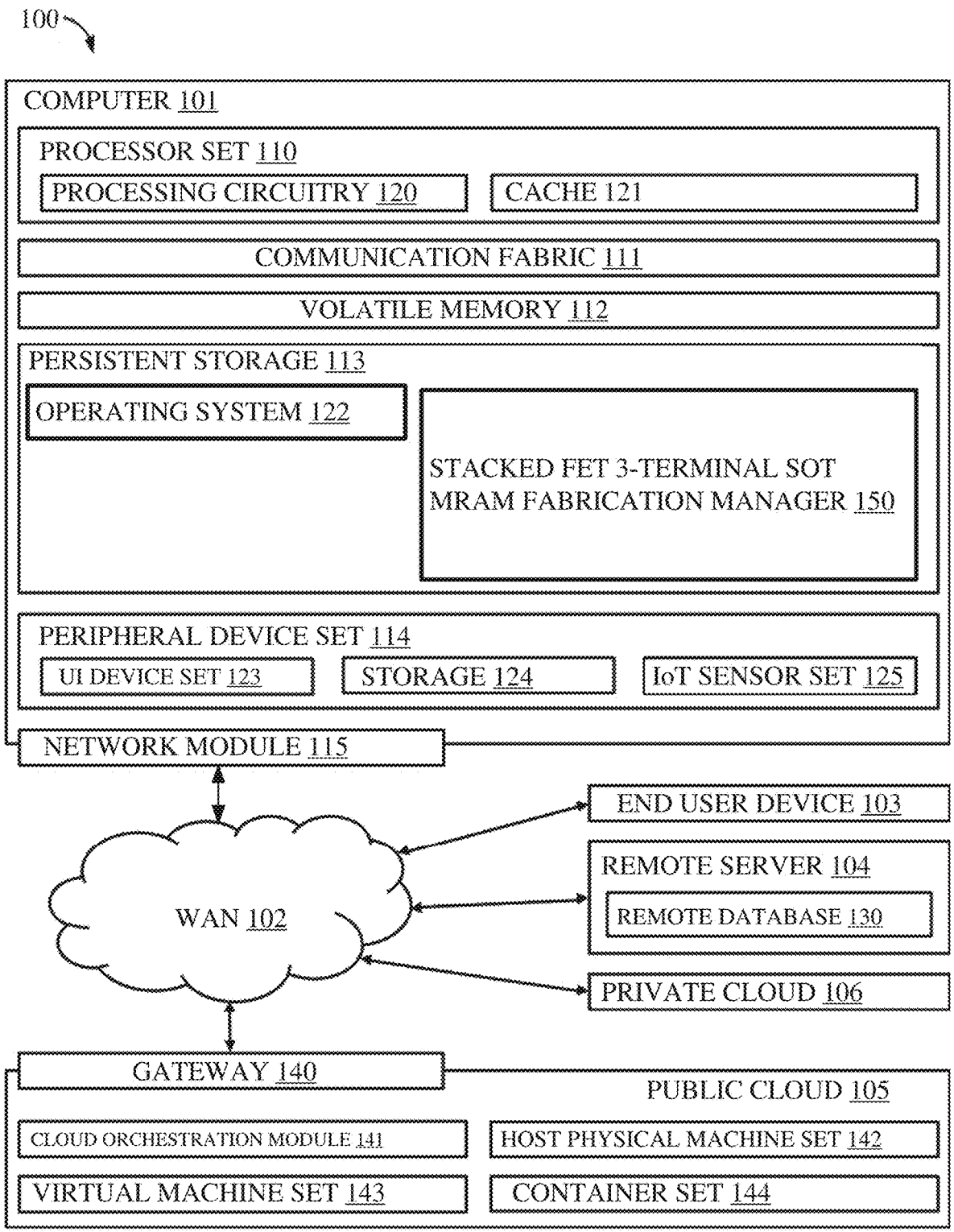
FIG. 1 is a block diagram of an example stacked field effect transistor (FET) with three-terminal spin-orbit torque (SOT) magnetoresistive random access memory (MRAM) fabrication manager, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the embodiments described. On the contrary, the intention is to cover all modifications, equivalents, and alternatives falling within the spirit and scope of the present disclosure.

DETAILED DESCRIPTION

As stated previously, three-terminal SOT MRAM can provide a separable read and write path as well as allowing to switch as sub 1 nanosecond (ns) regime using a different write mechanism, such as spin-orbit coupling. However, SOT MRAM may use two transistors, e.g., FETs, per cell for read and write operations, which increases a density penalty over other configurations, such as the one transistor per resistive RAM (RRAM) magnetic tunnel junction (1T/1R MTJ), which uses one transistor per cell. In SOT MRAM, one cell takes three transistor gate pitch is also referred to as CPP (contacted poly pitch) CPPs in the X direction and two fins (or, two nanosheet devices) in the Y direction with merged epitaxial layers (epis). Alternatively, the SOT MRAM can include a relatively wide nanosheet, which may not be practical to implement.

Accordingly, some embodiments of the present disclosure can provide a relatively higher density three-terminal SOT MRAM integrated with stacked nanosheet technology, and a method to fabricate such embodiments, which can provide a stacked FET SOT MRAM, having 3CPP per two cells, i.e., 1.5 CPP per cell. More specifically, such embodiments can include a three-terminal spin-orbit-torque MRAM array having an NFET transistor that drives the SOT line, with a gate connected to the write wordline. Additionally, such embodiments can include a PFET transistor connected to an MTJ, with a gate connected to the read wordline. Further, at least one type FET (i.e., n-type) is stacked on top of a different type FET (i.e., p-type). The method to fabricate such embodiments can be performed using stacked nanosheet technology by wafer bonding and contacting the bottom FETs through the isolation oxide.

In this way, some embodiments of the present disclosure can provide a memory device that represents an improvement over existing memory devices. Specifically, such embodiments may double the areal density achieved by current SOT schemes. Additionally, such embodiments can be compatible with technologies including, but not limited to, nanosheet, FinFET, and monolithic transistor integration. Further, in such embodiments, a strong pFET (e.g., a pFET with enhanced current drive) can be used for read operations using orientation engineering for top layer, or high mobility channel material (e.g., silicon-germanium and/or germanium [SiGe/Ge]). Additionally, in such embodiments, the PFET current can be tuned by increasing the number of pFET sheet numbers.

FIG. 1 is a block diagram of an example stacked field effect transistor (FET) with three-terminal spin-orbit torque (SOT) magnetoresistive random access memory (MRAM) fabrication manager 150, in accordance with some embodiments of the present disclosure.

In various embodiments, the example stacked FET with three-terminal SOT MRAM fabrication manager 150 can perform the method described in FIG. 3, and/or cause one or more machines to design, fabricate, and/or utilize components as discussed in FIGS. 2A, 2B, 4A-4L, 5A, and 5B. In some embodiments, the example stacked FET with three-terminal SOT MRAM fabrication manager 150 provides instructions for the aforementioned methods and/or functionalities to a client machine such that the client machine executes the method, or a portion of the method, based on the instructions provided by the example stacked FET with three-terminal SOT MRAM fabrication manager 150. In some embodiments, the example stacked FET with three-terminal SOT MRAM fabrication manager 150 comprises software executing on hardware incorporated into a plurality of devices.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as stacked FET three-terminal SOT MRAM fabrication manager 150. In addition, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 150, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 150 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 150 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optic al transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2A:
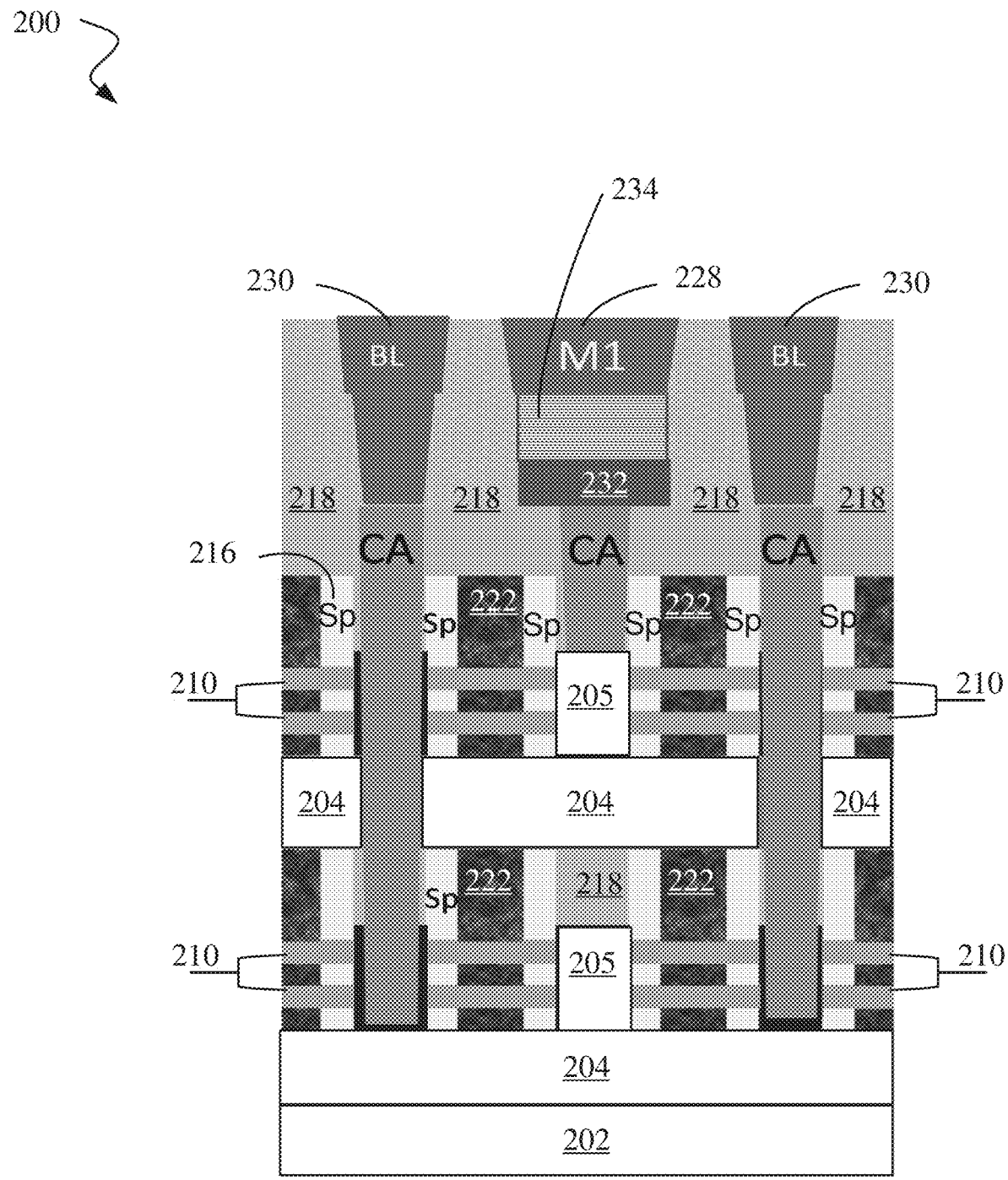
FIG. 2A is a side view of a stacked FET with three-terminal SOT MRAM, in accordance with some embodiments of the present disclosure.

FIG. 2A is a side view of a stacked FET with three-terminal SOT MRAM 200, in accordance with some embodiments of the present disclosure. The stacked FET with three-terminal SOT MRAM 200 includes substrate 202, isolation layer 204, source/drain epitaxy (S/D epi) 205, nanosheet channels 210, spacers (Sp) 216, interlayer dielectric (ILD) 218, high-K metal gates (HK/MGs) 222, metal layer (M1) 228, bit line (BL) 230, SOT channel 232 magnetic tunnel junction (MTJ) 234. The SOT channel 232 can be a heavy metal with high spin hall effect (SHE). The spin hall effect is the conversion of charge current to spin-polarized current, due to spin-orbit interaction. The SOT channel 232 can be a heavy metal.

The substrate 202 can represent a layer of silicon (Si). Further, the isolation layer 204 can be composed of a doped Si, epitaxial doped Si, buried oxide (BOX), such as, silicon dioxide ($SiO_2$), and the like. Further, the S/D epi 205 can represent a single crystal lattice structure across an interface. The nanosheet channels 210 can include nano-sheets, which may be a semiconductor that can be conductive in a transistor, "on" state, or highly resistive in a transistor, "off" state. The conductivity can be controlled by HK/MGs 222. The spacers 216 can be layers of material deposited and etched back to provide a spacing between the HK/MGs 222 and the contacts (CA). Additionally, the ILD 218 may be a dielectric material with a relatively low-k constant (e.g., k=3.9 or less). The HK/MGs 222 can provide the conductive gate electrode for the transistors. The materials for the HK/MGs may differ based on the type of device under construction (e.g., N-type or P-type). The metal layer 222 can provide a power supply or ground for the MRAM 200. The bit line 230 can be a set of memory cells used to generate a memory address, in combination with a read or write WL.

According to some embodiments of the present disclosure, the three-terminal SOT MRAM 200 can represent a structure having a three-terminal spin-orbit-torque MRAM array where an NFET transistor drives the SOT line (SL) with a gate connected to the write wordline (WW). Additionally, a PFET transistor connected to the magnetic tunnel junction (MTJ) with the gate connected to a read wordline and at least one type FET (i.e., N-type) is stacked on top of another type FET (i.e., P-type). This stacked NFET and PFET configuration can provide higher memory density compared to conventional three-terminal SOT MRAM.

Figure 2B:
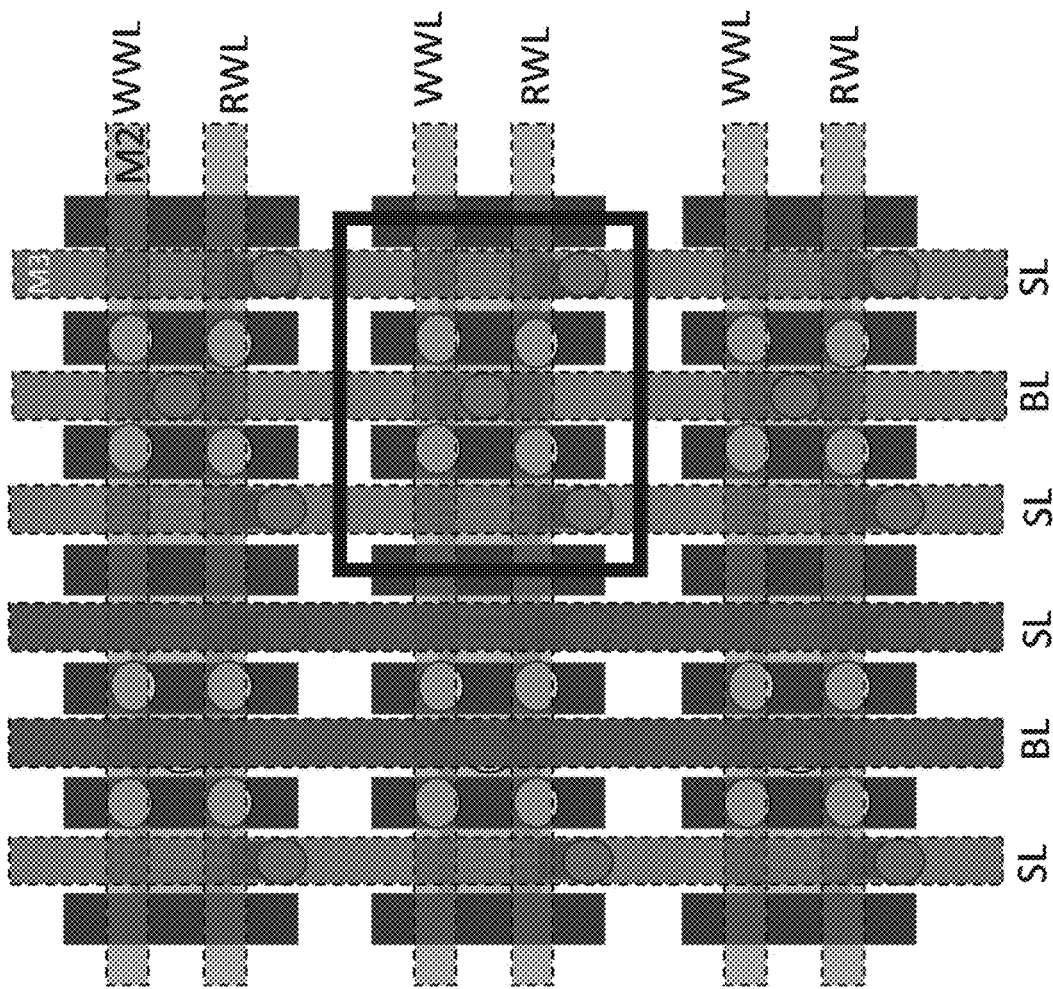
FIG. 2B is a top view of the stacked FET with three-terminal SOT MRAM, in accordance with some embodiments of the present disclosure.

FIG. 2B is a top view of the stacked FET with three-terminal SOT MRAM 200, in accordance with some embodiments of the present disclosure. The three-terminal SOT MRAM 200 includes read word lines (RWLs) and write word lines (WWLs) in the horizontal direction, and SOT lines (SLs) and bit lines (BLs) in the vertical direction. By providing electric current along a specific RWL or WWL and BL, the three-terminal SOT MRAM 200 can identify the specific HK/MG being written to, or read from.

Figure 2C:
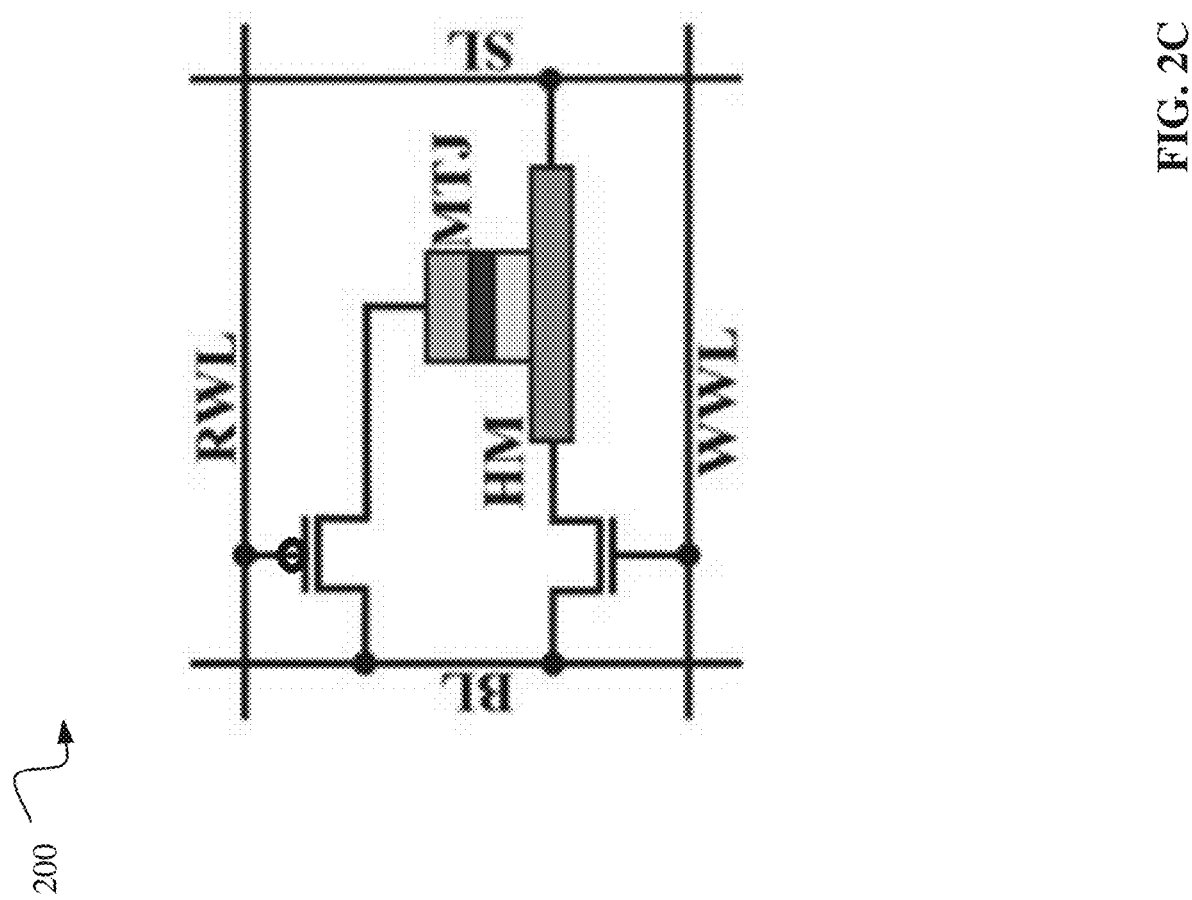
FIG. 2C is a schematic diagram of the stacked FET with three-terminal SOT MRAM, in accordance with some embodiments of the present disclosure.

FIG. 2C is a schematic of the stacked FET with three-terminal SOT MRAM 200, in accordance with some embodiments of the present disclosure. The three-terminal SOT MRAM 200 includes an RWL and WWL in the horizontal direction, and SL and BL in the vertical direction. Further, the three-terminal SOT MRAM 200 includes an SOT channel made of heavy metal (HM), and magnetic tunnel junction (MTJ). The MTJ can be a magnetic storage device in which two magnetic layers are separated by an insulating barrier allowing an electronic current whose magnitude depends on the orientation of both magnetic layers to tunnel through the barrier when it is subject to a small electric bias.

According to some embodiments of the present disclosure, the three-terminal SOT MRAM 200 can read data from the MTJ, and write data to the MTJ through the SOT channel by providing current to the S/D epis 205. The specific S/D epi 205 can be determined by the WL and BL carrying current, which flows through the contacts (CA) to the S/D epi 205. More specifically, current flowing through the read WL can cause a read operation. Similarly, current flowing through the write WL can cause a write operation. In this way, the three-terminal SOT MRAM 200 can store and retrieve data.

More specifically, the three-terminal SOT MRAM 200 can perform read and write operations by setting values for the WWL, RWL, BL and SL, by either providing current (e.g., value=1), or not providing current (e.g., value=0). Thus, for a write operation, the three-terminal SOT MRAM 200 can set the value for WWL=RWL=1. Further, the three-terminal SOT MRAM 200 can set the values for BL/SL=Vw/GND or GND/Vw, depending on the value being stored. In contrast, for a read operation the three-terminal SOT MRAM 200 can set the value for WWL=RWL=0, and the values for BL/SL=Vr/VDD. Here Vw and Vr refer to write voltage and read voltages, respectively which depend on the SOT and MTJ properties.

Figure 3A:
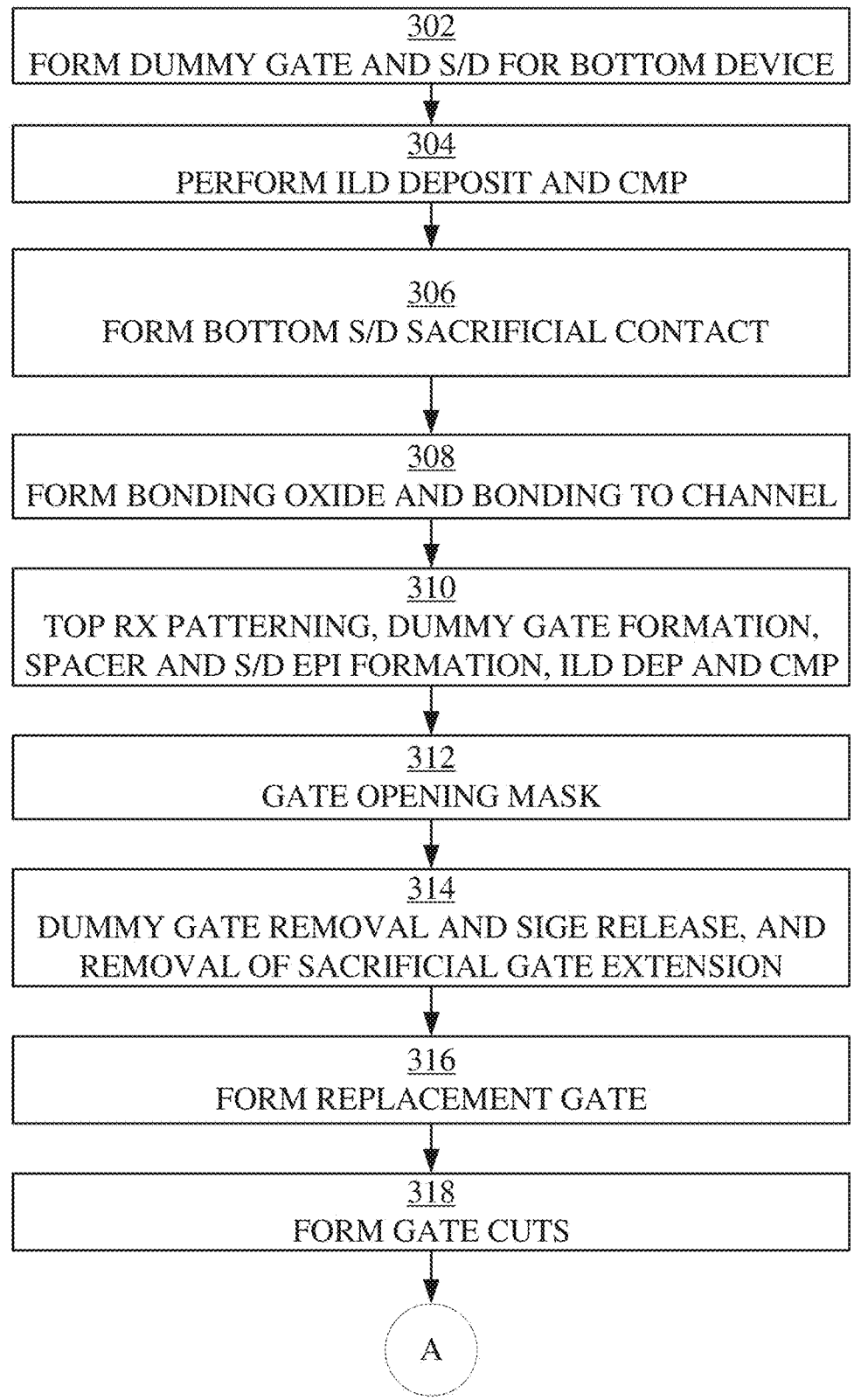
FIGS. 3A and 3B are a process flow chart of a method for fabricating a stacked FET device with three-terminal SOT MRAM, in accordance with some embodiments of the present disclosure.
Figure 3B:
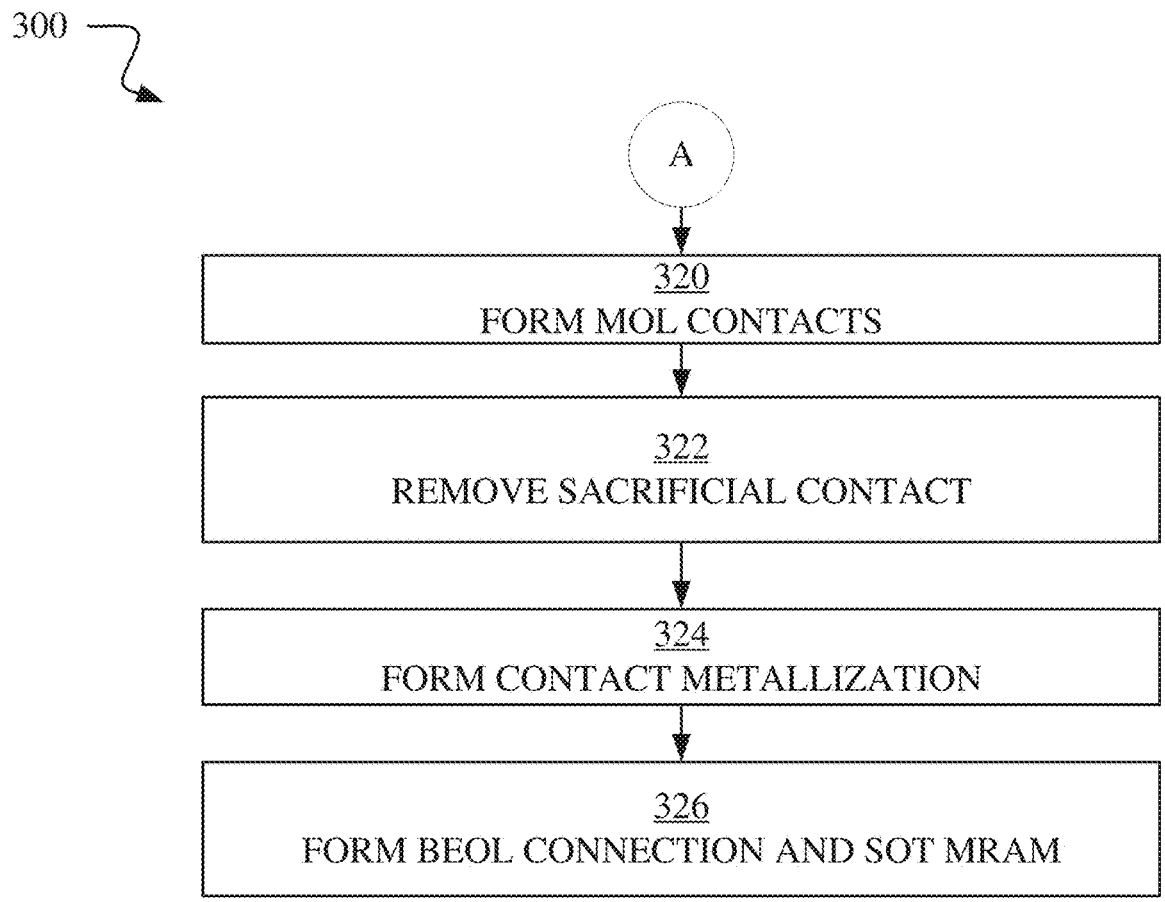

FIG. 3 (encompassing FIGS. 3A and 3B) is a process flow chart of a method for fabricating a stacked FET device with three-terminal SOT MRAM, in accordance with some embodiments of the present disclosure. In some embodiments, an example stacked FET with three-terminal SOT MRAM fabrication manager, such as the example stacked FET with three-terminal SOT MRAM fabrication manager 150 described with respect to FIG. 1, can perform the method 300. In this method, the three-terminal SOT MRAM fabrication manager 150 can fabricate above three-terminal spin-orbit-torque MRAM structure using stacked nanosheet technology by wafer bonding and contacting the bottom FETs through an isolation oxide. By fabricating the three-terminal SOT MRAM 200 in this way, some embodiments of the present disclosure can improve the area density of current SOT MRAM devices. Further, such embodiments can adjust pFET current without a penalty for areas using a stronger stacked FinFET (e.g., Fin height, channel orientation, or channel SiGe) or Stacked nanosheet with an increased number of vertical stacks. In some embodiments of the present disclosure, the three-terminal SOT MRAM 200 can provide a stacked FET SOT MRAM with 3CPP for two cells (i.e., 1.5 CPP per one cell). In contrast, current three-terminal SOT MRAMs may only provide 3CPP per one cell. For clarity, the method 300 is described with respect to FIGS. 4A through 4L.

FIGS. 4A, 4B, 4C, 4D, 4E, 4F, 4G, 4H, 4I, 4J, 4K, and 4L are example fabrication states of an example stacked FET with three-terminal SOT MRAM, in accordance with some embodiments of the present disclosure. The example fabrication states 4A-4L include a top view 400-T, and multiple side views (e.g., X, Y1, Y2, Y3) of the fabricated cell(s). Accordingly, the top view represents an active region 403 of the transistors and three pillars 401. The active region 403 includes channel under gates, channel under spacer regions, and source/drain regions. The pillars 401 can represent the location of the gates of the three-terminal SOT MRAM 200.

Further, the side views are represented as a cross section of the cell(s) from the view of the corresponding cut lines in the top view 400-T. For example, in FIG. 4A, the view X shows a cross section of the cell(s), along cut line X. Similarly, the views Y1, Y2, and Y3 show cross-section views of the cell(s) along cut lines Y1, Y2, and Y3. In this way, the example fabrication state 4A can represent the cell(s) after operation 302 of the method 300. Similarly, the views X, Y1, Y2, and Y3 of example fabrication states 4B through 4L can represent the cell(s) after operations 304 through 320, respectively.

Referring back to FIG. 3A, at operation 302, the stacked FET with three-terminal SOT MRAM fabrication manager 150 can direct a fabrication tool to form dummy gates and S/D epis. Forming dummy gates can involve depositing sacrificial layers that serve as placeholders for gates. More specifically, the stacked FET with three-terminal SOT MRAM fabrication manager 150 can direct a fabrication tool to form a patterned nanosheet stack over isolation layer 404. The patterned nanosheet stack includes sacrificial nanosheet layers 412, which may be composed of SiGe, for example. Additionally, the channel nanosheet layers 410 may be composed of Si, for example. Further, the stacked FET with three-terminal SOT MRAM fabrication manager 150 can direct a fabrication tool to deposit dummy gate 408 and gate hardmask layer 406 over the patterned nanosheet stack, and perform dummy gate patterning. Additionally, the stacked FET with three-terminal SOT MRAM fabrication manager 150 can direct a fabrication tool to form the spacers 414 at the sidewalls of the dummy gate 408 and gate hardmask 406. Further, the stacked FET with three-terminal SOT MRAM fabrication manager 150 can direct a fabrication tool to etch the nanosheet stacks that are not protected by the gate hardmask 406 and spacers 414. Additionally, the stacked FET with three-terminal SOT MRAM fabrication manager 150 can direct a fabrication tool to perform SiGe indentation and form inner spacers. Further, the stacked FET with three-terminal SOT MRAM fabrication manager 150 can direct a fabrication tool to grow the S/D epis 405 over the exposed channel nanosheet layers 410.

Figure 4A:
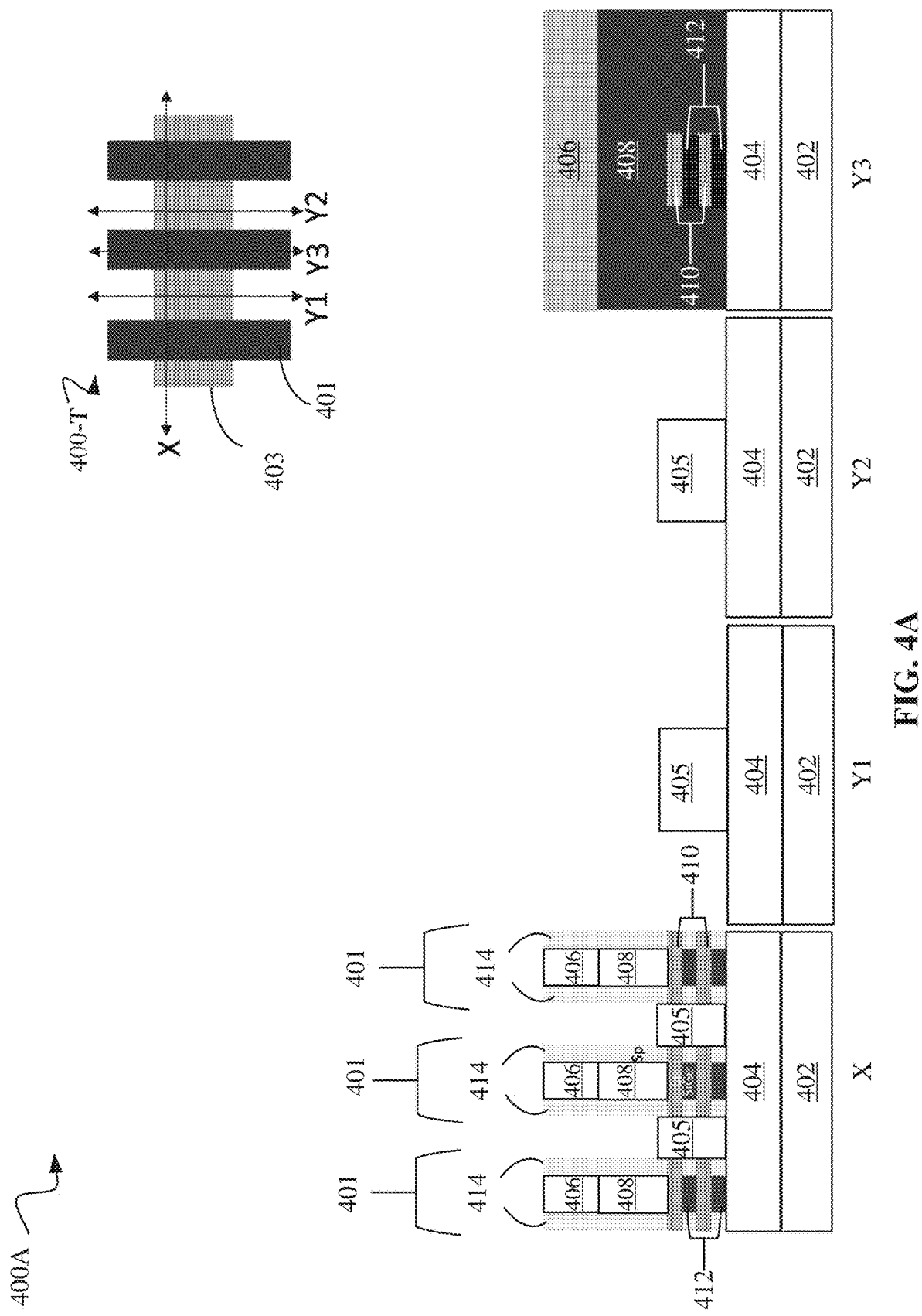
FIGS. 4A, 4B, 4C, 4D, 4E, 4F, 4G, 4H, 4I, 4J, 4K, and 4L are example fabrication states of an example stacked FET with three-terminal SOT MRAM, in accordance with some embodiments of the present disclosure.

FIG. 4A is an example fabrication state 400A of a stacked FET with three-terminal SOT MRAM, according to some embodiments of the present disclosure. The example fabrication state 400A may represent the state of a cell of the stacked FET with three-terminal SOT MRAM after operation 302.

The view X includes substrate 402, isolation layer 404, sacrificial nanosheet layer 412, hard mask cap 406, and source-drain epitaxy (S/D epi) 405. More specifically, the substrate 402 is Si substrate. Further, the isolation layer 404 can represent an isolation layer, and can be composed of silicon dioxide (SiO$_2$). Additionally, the sacrificial nanosheet layer 412 can be a layer of SiGe that serves as a placeholder for a gate to be fabricated. Accordingly, the sacrificial nanosheet layer 412 surrounds the channel nanosheet layers 410 of the cell 402-L, similar to a gate. To protect the sacrificial nanosheet layer 412, the hard mask cap 406 can provide a cap.

The views Y1 and Y2 include substrate 402, isolation layer 404, and S/D epi 405. According to some embodiments of the present disclosure, the S/D epi 405 can be an n-type epitaxy or a p-type epitaxy. The view Y3 includes substrate 402, isolation layer 404, channel nanosheet layers 410, sacrificial nanosheet layer 412, hard mask cap 406, and dummy gate 408. In this way, the example fabrication state 400A can represent the result of operation 302.

Referring back to FIG. 3, at operation 304, the three-terminal SOT MRAM fabrication manager 150 can perform interlayer dielectric (ILD) deposit and chemical mechanical planarization. Performing ILD deposit can involve depositing ILD material (e.g., ILD 418). Further, performing CMP can involve using chemicals and mechanical processes to remove the hard mask cap 406 and surrounding spacers 414.

At operation 306, the three-terminal SOT MRAM fabrication manager 150 can form a bottom S/D sacrificial contact. Forming the bottom S/D sacrificial contact can involve depositing a sacrificial material in the ILD 418.

Figure 4B:
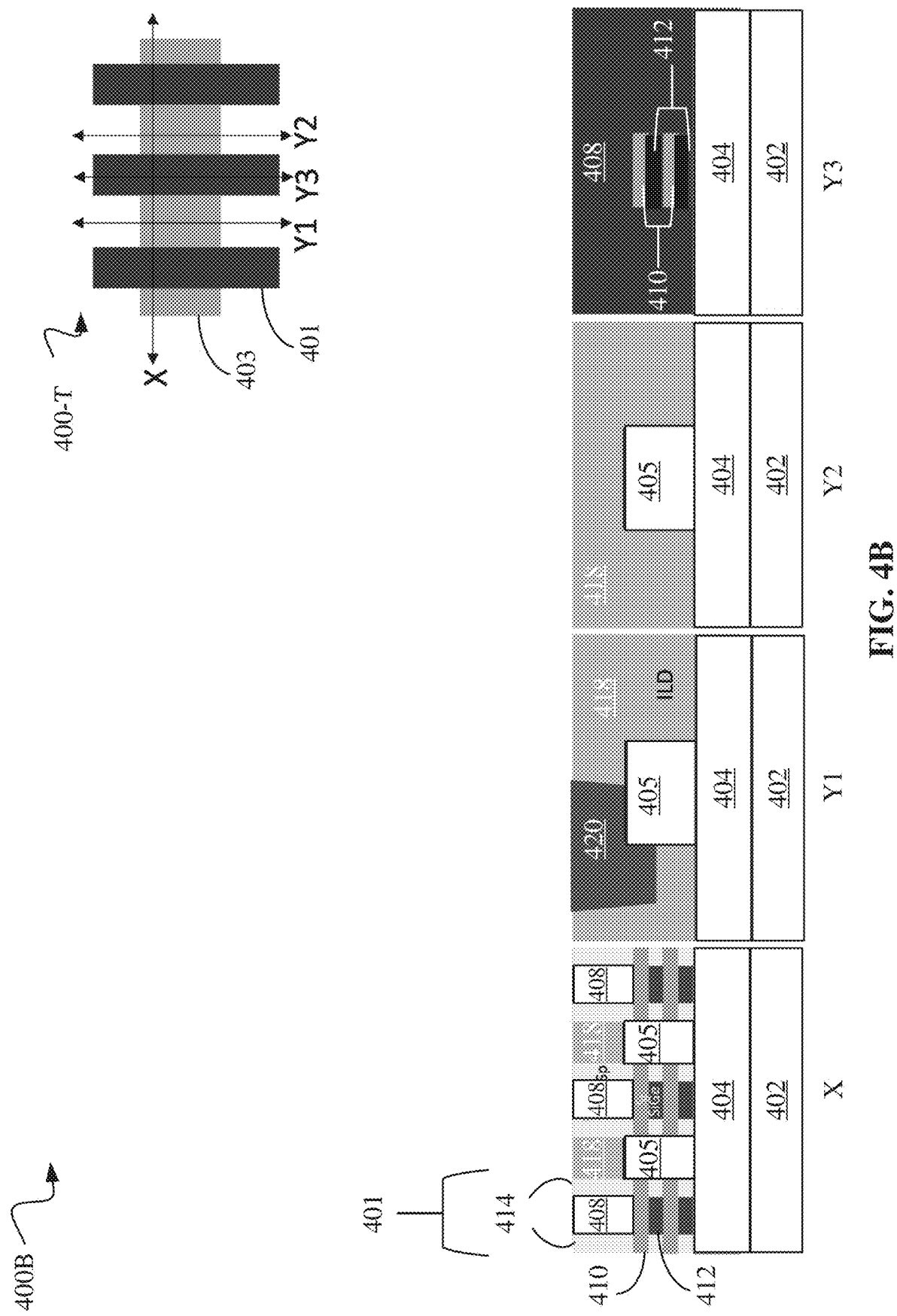

FIG. 4B is a block diagram of an example fabrication state 400B of a stacked FET with three-terminal SOT MRAM, in accordance with some embodiments of the present disclosure. The example fabrication state 400B can represent the three-terminal SOT MRAM after operations 304 and 306.

The view X includes substrate 402, isolation layer 404, S/D epis 405, dummy gate 408, channel nanosheet layers 410, sacrificial nanosheet layer 412, spacers 414, and ILD 418. The ILD 418 may be a dielectric material with a relatively low-k constant (e.g., k=3.9 or less) that electrically separates relatively close interconnect lines (e.g., channel nanosheet layers 410) arranged in several levels. The low k dielectric material can mitigate capacitive coupling between neighboring channel nanosheet layers 410. In comparison to example fabrication state 400A, the view X shows the result of operation 304, namely the hard mask cap 406 from example fabrication state 400A is removed through the CMP process, and the ILD 418 is deposited on the S/D epis 205.

The Y1 view includes the substrate 402, isolation layer 404, S/D epi 405, ILD 418, and bottom S/D sacrificial contact 420. The bottom S/D sacrificial contact 420 can be a placeholder for a contact to the S/D epi 205. The Y2 view includes the substrate 402, isolation layer 404, S/D epi, and ILD 418. In comparison to example fabrication state 400A, the views Y1, Y2 show the result of operation 304, namely the ILD 418 is deposited on the S/D epis 205.

The Y3 view includes the substrate 402, isolation layer 404, dummy gate 408, channel nanosheet layers 410, and sacrificial nanosheet layer 412. In comparison to example fabrication state 400A, the view Y3 shows the result of operation 304, namely the hard mask cap 406 from example fabrication state 400A is removed through the CMP process.

Referring back to FIG. 3, at operation 308, the three-terminal SOT MRAM fabrication manager 150 can form bonding oxide and bonding to channel. Forming bonding oxide can involve generating an isolation layer for of the three-terminal SOT MRAM that isolates the bottom layer from the top layer to be fabricated. Additionally, bonding to channel can involve depositing additional sacrificial nanosheet layers 412 and channel nanosheet layers 410.

Figure 4C:
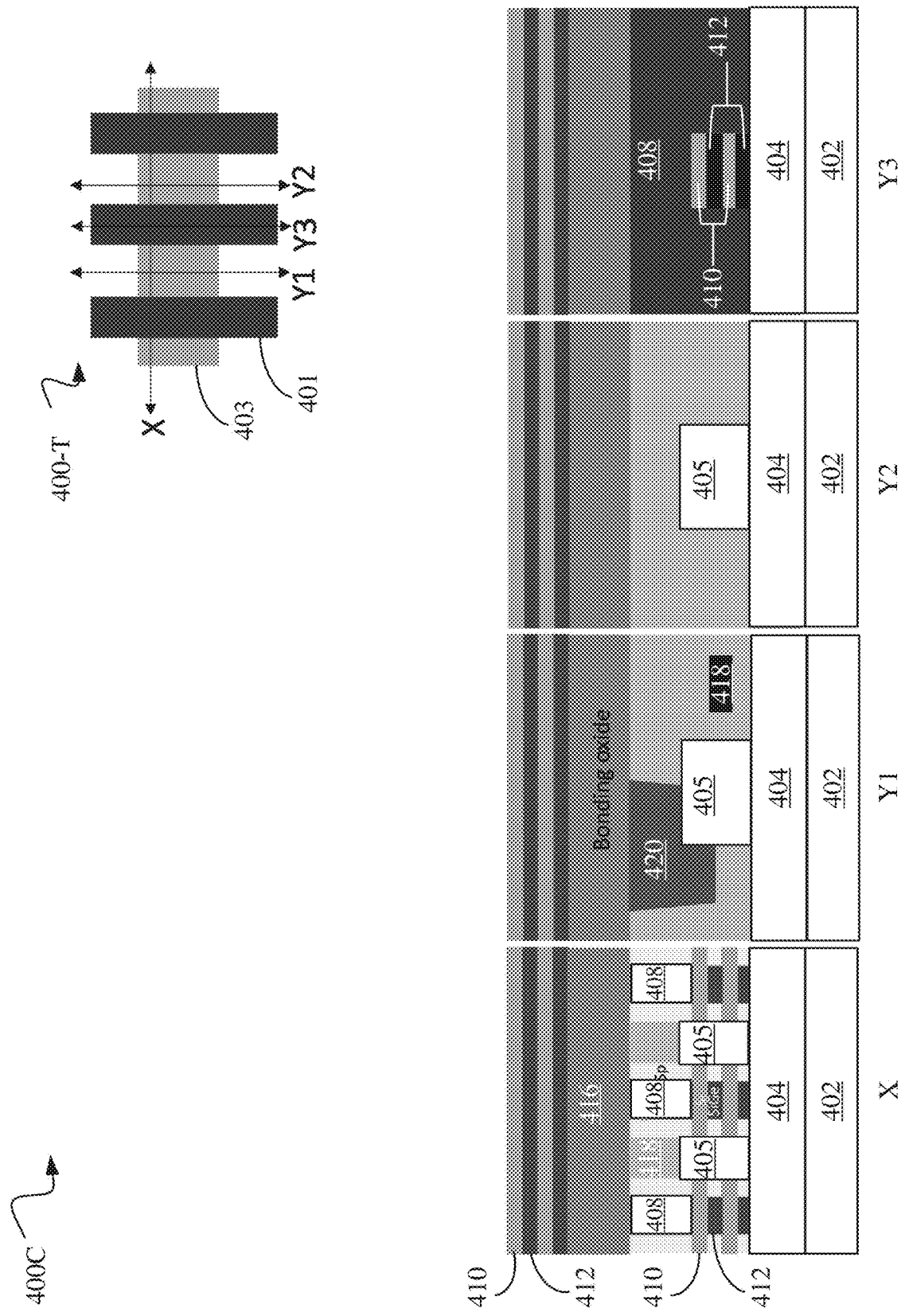

FIG. 4C is a block diagram of an example fabrication state 400C of a stacked FET with three-terminal SOT MRAM, in accordance with some embodiments of the present disclosure. The example fabrication state 400C can represent the three-terminal SOT MRAM after operation 308. In comparison to example fabrication state 400B, example fabrication state 400C includes the additional elements of the sacrificial nanosheet layers 412 and channel nanosheet layers 410. More specifically, the views X, Y1, Y2, and Y3 include the sacrificial nanosheet layers 412 and channel nanosheet layers 410 over the bottom layer of the three-terminal SOT MRAM.

Referring back to FIG. 3A, at operation 310, the stacked FET with three-terminal SOT MRAM fabrication manager 150 can direct the fabrication tool to perform top active region patterning, dummy gate formation, spacer and s/d epi formation, ILD deposition and CMP. The operation 310 can be similar to the operations 302 and 304. However, operation 310 may be performed with respect to the top layer of the stacked FET with three-terminal SOT MRAM.

Figure 4D:
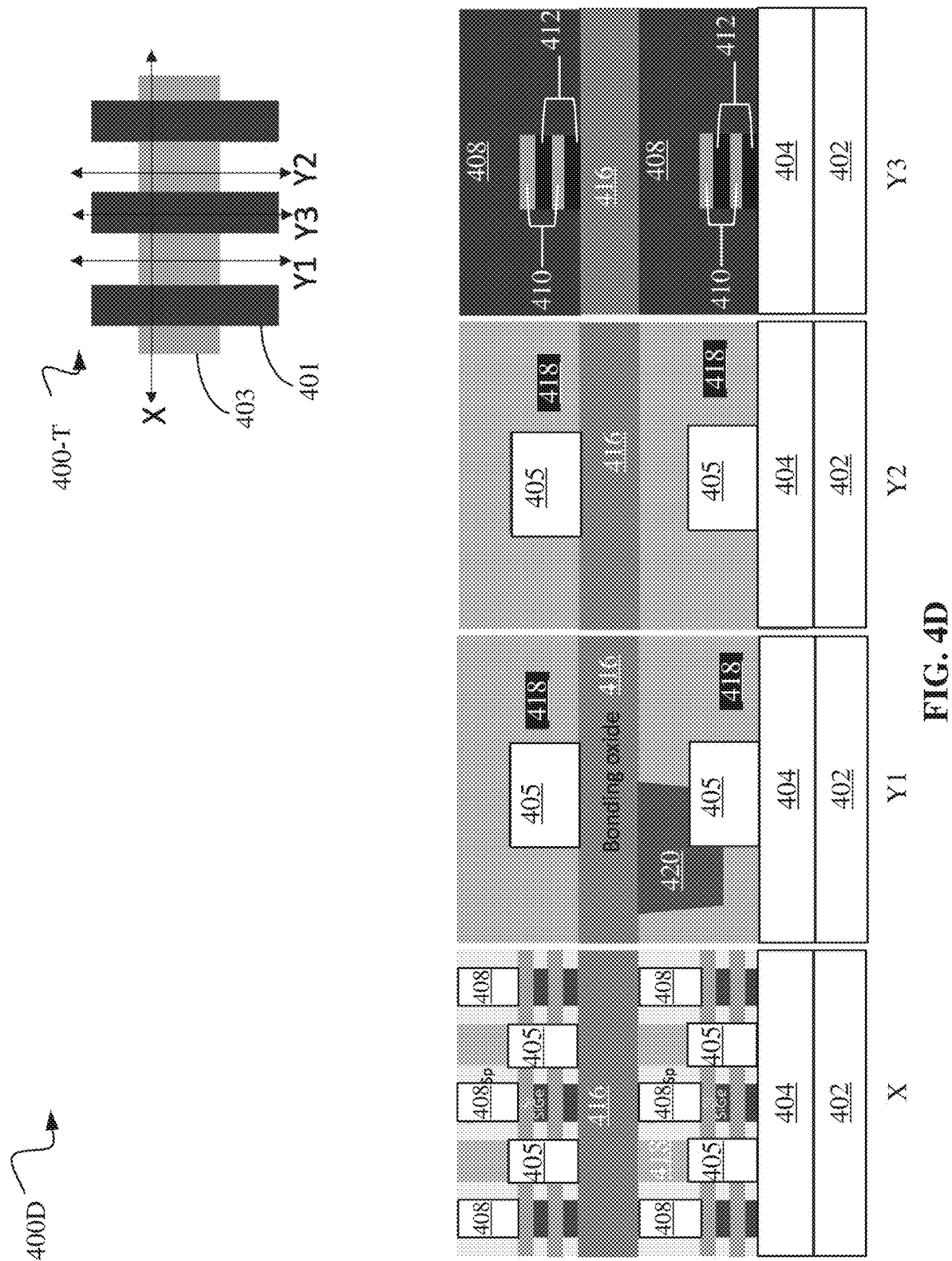

FIG. 4D is a block diagram of an example fabrication state 400D of an example stacked FET with three-terminal SOT MRAM, in accordance with some embodiments of the present disclosure. The example fabrication state 400D can represent the three-terminal SOT MRAM after operation 310. As stated previously, operation 310 is similar to operations 302 and 304 described above. Accordingly, the views X, Y1, Y2, and Y3 include a top layer similar to the bottom layer described with respect to FIG. 4A.

In comparison to example fabrication state 400C, the views X, Y1, Y2, Y3 of example fabrication state 400D shows the result of operation 310, namely a top layer similar to the bottom layer below the bonding oxide 416. However, view Y1 does not include the sacrificial bottom S/D epi contact 420 in the top layer.

Referring back to FIG. 3, at operation 312, the stacked FET with three-terminal SOT MRAM fabrication manager 150 can direct the fabrication tool to perform a gate opening mask. Performing the gate opening mask can involve etching openings 421 into the top and bottom dummy gates 408 of the three-terminal SOT MRAM.

Figure 4E:
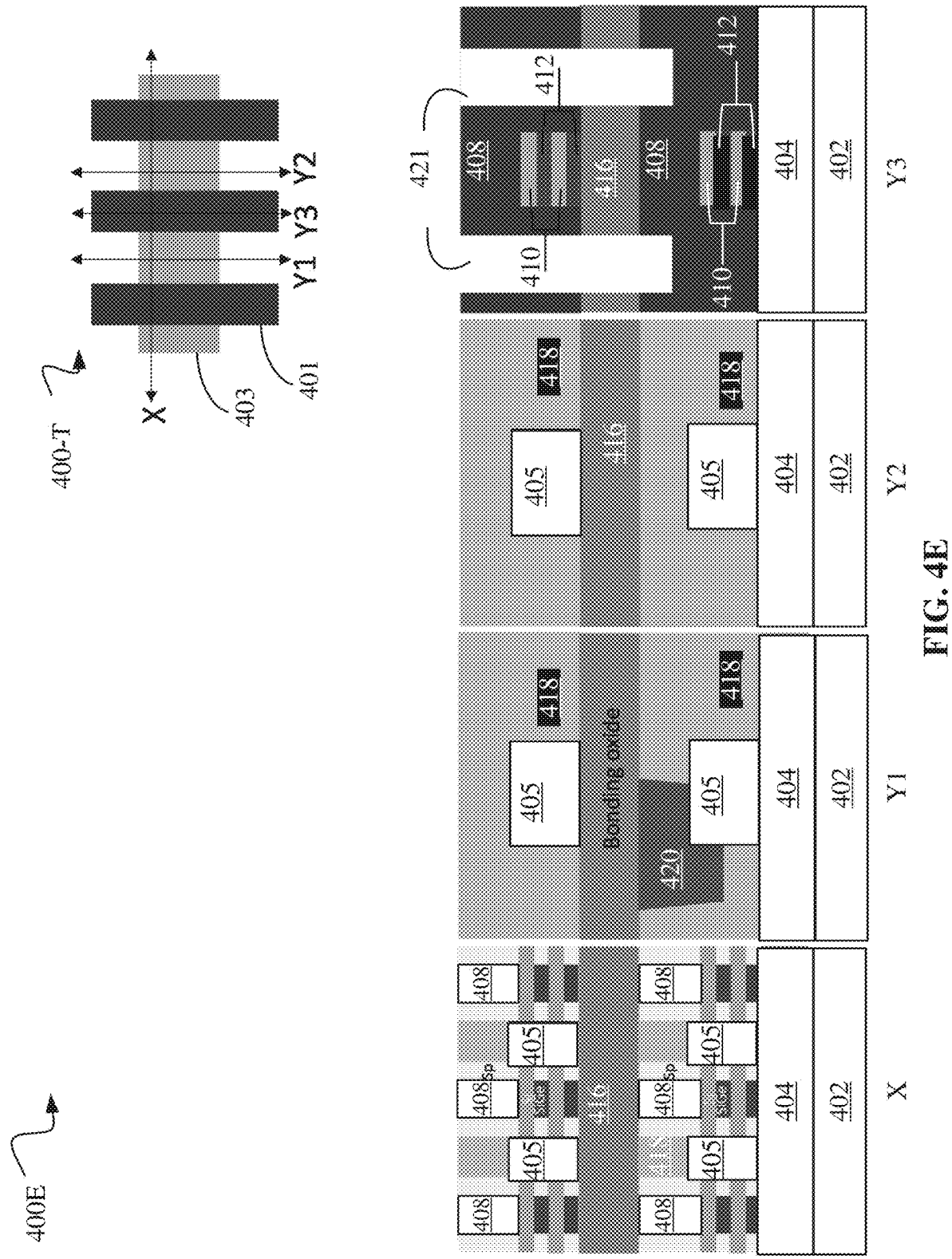

FIG. 4E is a block diagram of an example fabrication state 400E of an example stacked FET with three-terminal SOT MRAM, in accordance with some embodiments of the present disclosure. The example fabrication state 400E can represent the three-terminal SOT MRAM after operation 312.

In comparison to example fabrication state 400D, the example fabrication state 400E is similar with respect to views X, Y1, and Y2. However, view Y3 includes openings 421. In this way, the example fabrication state 400E represents the result of operation 312.

Referring back to FIG. 3, at operation 314, the stacked FET with three-terminal SOT MRAM fabrication manager 150 can direct the fabrication tool to perform dummy gate removal and SiGe release, and removal of sacrificial gate extension. Removing the dummy gate can involve an etching process that removes the dummy gate 408. Further, the SiGe release can involve a chemical process that removes the sacrificial nanosheet layers 412 selective to the channel nanosheet layers 410.

Figure 4F:
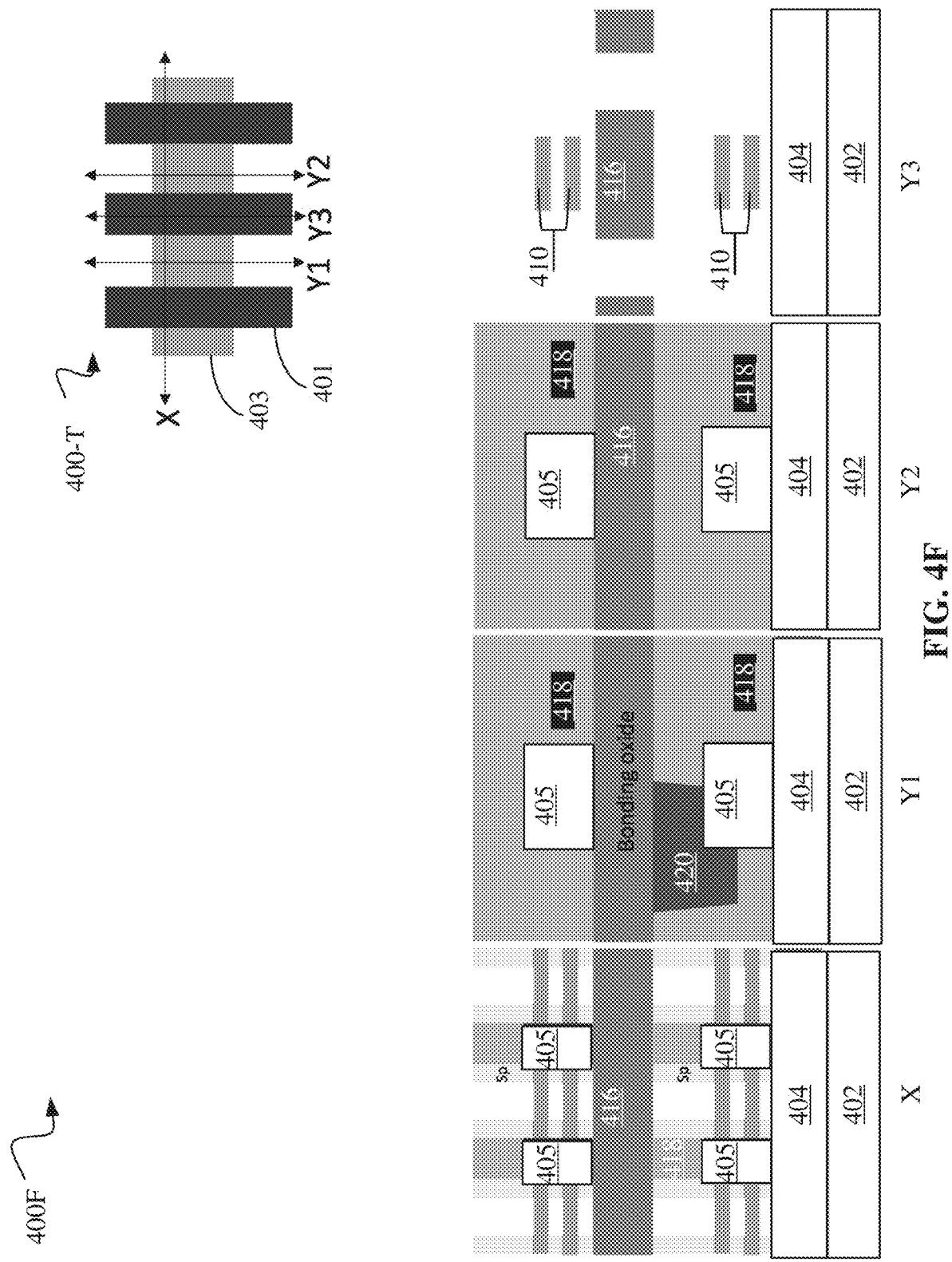

FIG. 4F is a block diagram of an example fabrication state 400F of an example stacked FET with three-terminal SOT MRAM, in accordance with some embodiments of the present disclosure. The example fabrication state 400F can represent the three-terminal SOT MRAM after operation 314.

As shown, in comparison to example fabrication state 400E, the example fabrication state 400E no longer includes the elements removed by operation 314. Specifically, the view X no longer includes the dummy gate 408 and sacrificial nanosheet layers 412. Similarly, the view Y3 no longer includes the dummy gate 408 and sacrificial nanosheet layers 412. However, the Y1 and Y2 views are unchanged in comparison to example fabrication state 400E. In these ways, the example fabrication state 400F represents the result of operation 314.

Referring back to FIG. 3, at operation 316, the stacked FET with three-terminal SOT MRAM fabrication manager 150 can direct the fabrication tool to form a replacement gate. Forming the replacement gate can involve using the openings 421 to deposit high-k metal gate material in the spaces created by removing the dummy gate 408 and sacrificial nanosheet layers 412.

Figure 4G:
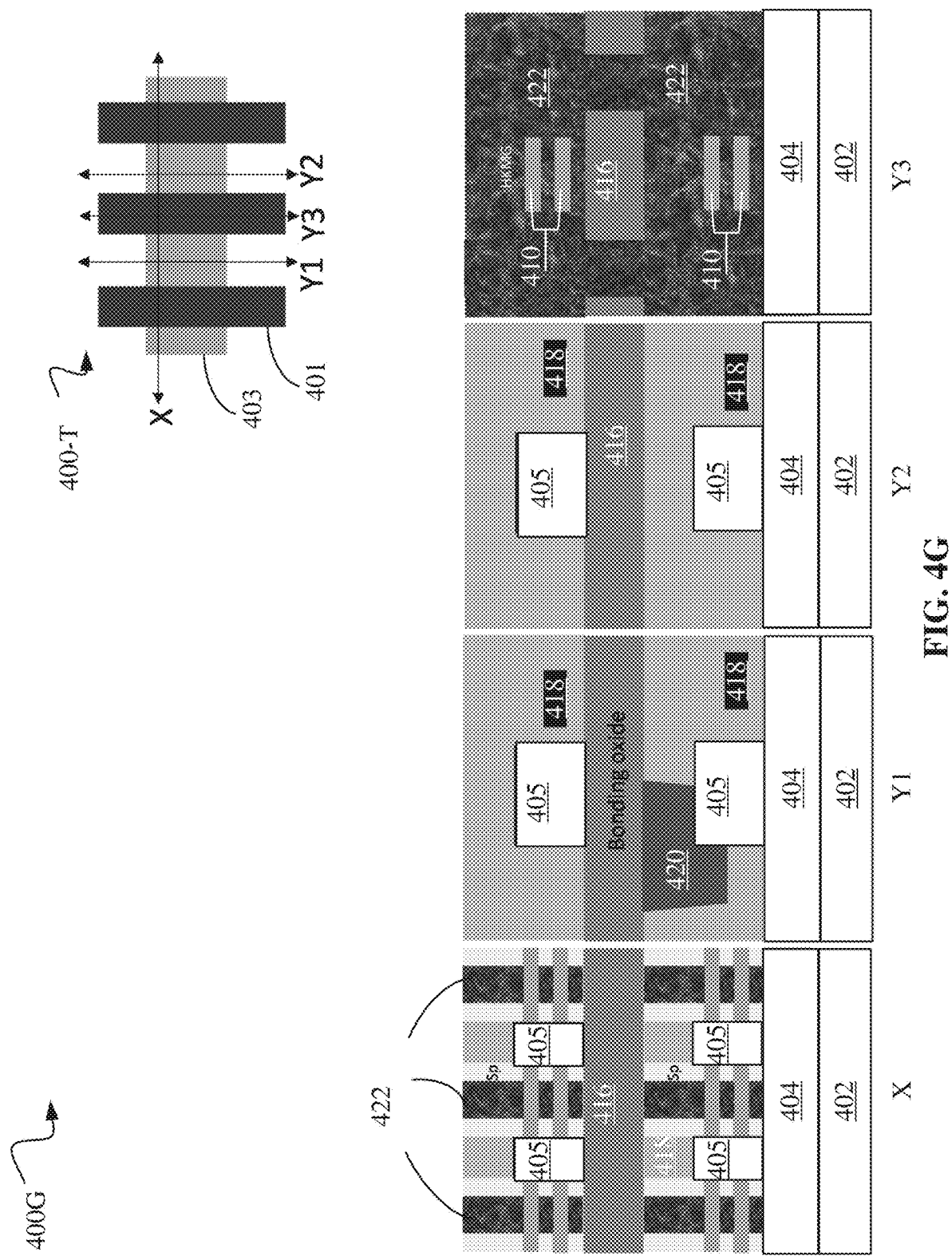

FIG. 4G is a block diagram of an example fabrication state 400G of an example stacked FET with three-terminal SOT MRAM, in accordance with some embodiments of the present disclosure. The example fabrication state 400G can represent the three-terminal SOT MRAM after operation 316.

In comparison to example fabrication state 400F, the example fabrication state 400G shows the spaces that are emptied by operation 314, filled with high-k metal gate material 422. Specifically, views X and Y3 include the deposited high-k metal gate material 422. In contrast, the views Y1 and Y2 are unchanged from example fabrication state 400F. In these ways, the example fabrication state 400G represents the result of operation 316.

Referring back to FIG. 3, at operation 318, the stacked FET with three-terminal SOT MRAM fabrication manager 150 can direct the fabrication tool to form gate cuts. Forming the gate cuts can involve removing high-k gate material 422.

Figure 4H:
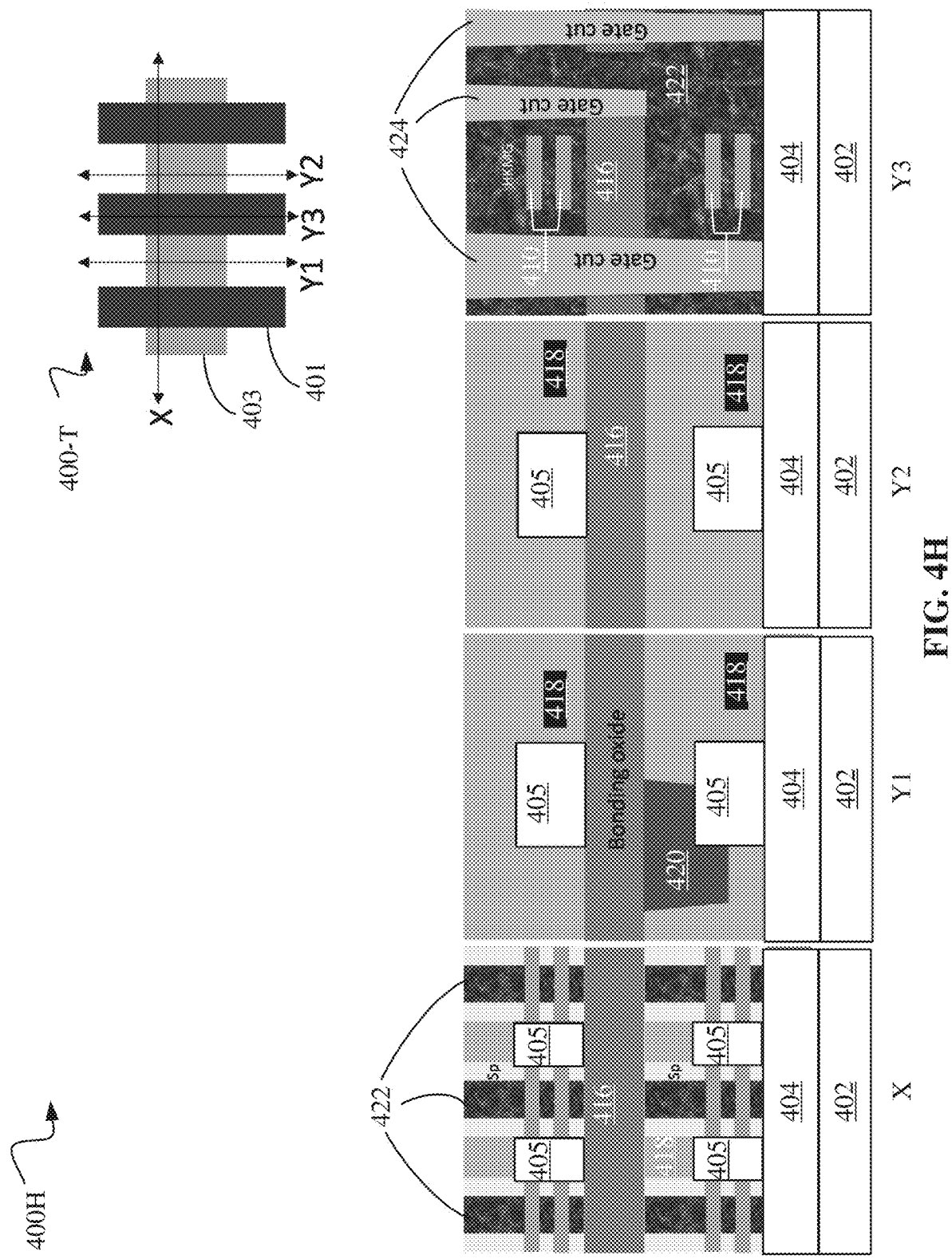

FIG. 4H is a block diagram of an example fabrication state 400H of an example stacked FET with three-terminal SOT MRAM, in accordance with some embodiments of the present disclosure. The example fabrication state 400H can represent the three-terminal SOT MRAM after operation 318.

In comparison to example fabrication state 400G, the views X, Y1, and Y2 are unchanged. However, the view Y3 shows the gate cuts 424 formed by the removal of the high-k metal gate material 422. In this way, the example fabrication state 400H represents the result of operation 318.

Referring back to FIG. 3A, the operation 318 shows a flow to a placeholder A. The placeholder A does not represent an operation of the method, but serves to connect the operations described in FIG. 3A with the other operations of method 300, which are described in greater detail with respect to FIG. 3B.

FIG. 3B is a process flow chart of operations 320 through 326 of the method 300, in accordance with some embodiments of the present disclosure. For clarity, these operations are described with respect to FIGS. 4I through 4L.

The process flow chart of FIG. 3B shows a flow from placeholder A to operation 320. As stated previously, the placeholder A does not represent an operation of the method 300, but serves to connect the operations 302-318 described in FIG. 3A with operations 320-326 described below.

At operation 320, the stacked FET with three-terminal SOT MRAM fabrication manager 150 can direct the fabrication tool to form middle of line (MOL) contacts. Forming middle of line contacts can involve removing ILD 418 to provide access to the S/D epis 405 and the bottom S/D sacrificial contact 420.

Figure 4I:
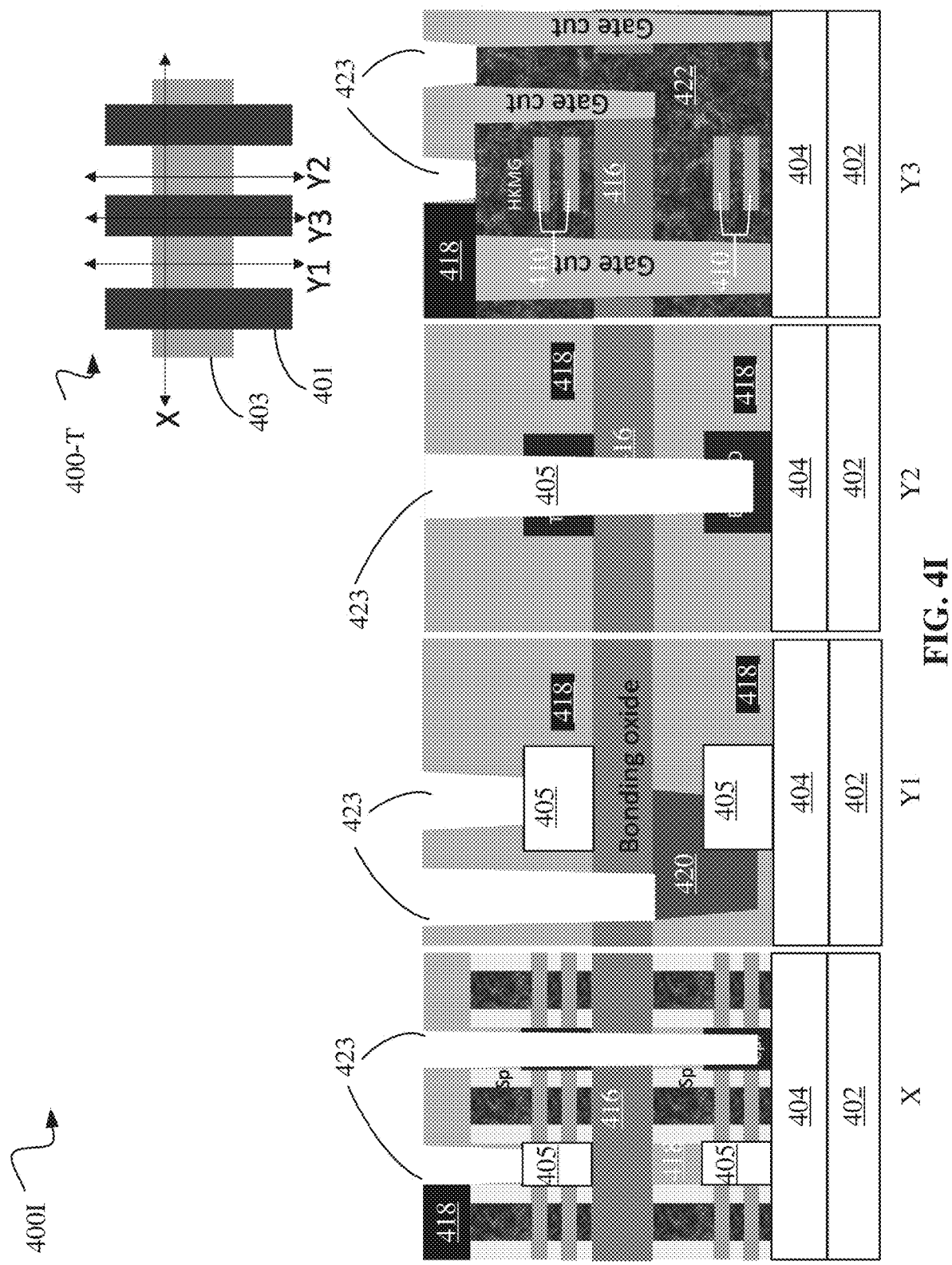

FIG. 4I is a block diagram of an example fabrication state 400I of stacked FET with three-terminal SOT MRAM, in accordance with some embodiments of the present disclosure. The example fabrication state 400I can result from operation 320.

In comparison to example fabrication state 400H, the example fabrication state 400I shows contact openings 423 created by the removal of ILD 418 in operation 320. Specifically, views X, Y1, Y2, and Y3 include the openings 423, which provide access to the S/D epis 405 and the bottom S/D sacrificial contact 420. In this way, the example fabrication state 400I represents the result of operation 320.

Referring back to FIG. 3B, at operation 322, the stacked FET with three-terminal SOT MRAM fabrication manager 150 can direct the fabrication tool to remove the sacrificial contact. Removing the sacrificial contact can involve an etching process that removes the bottom S/D sacrificial contact 420.

Figure 4J:
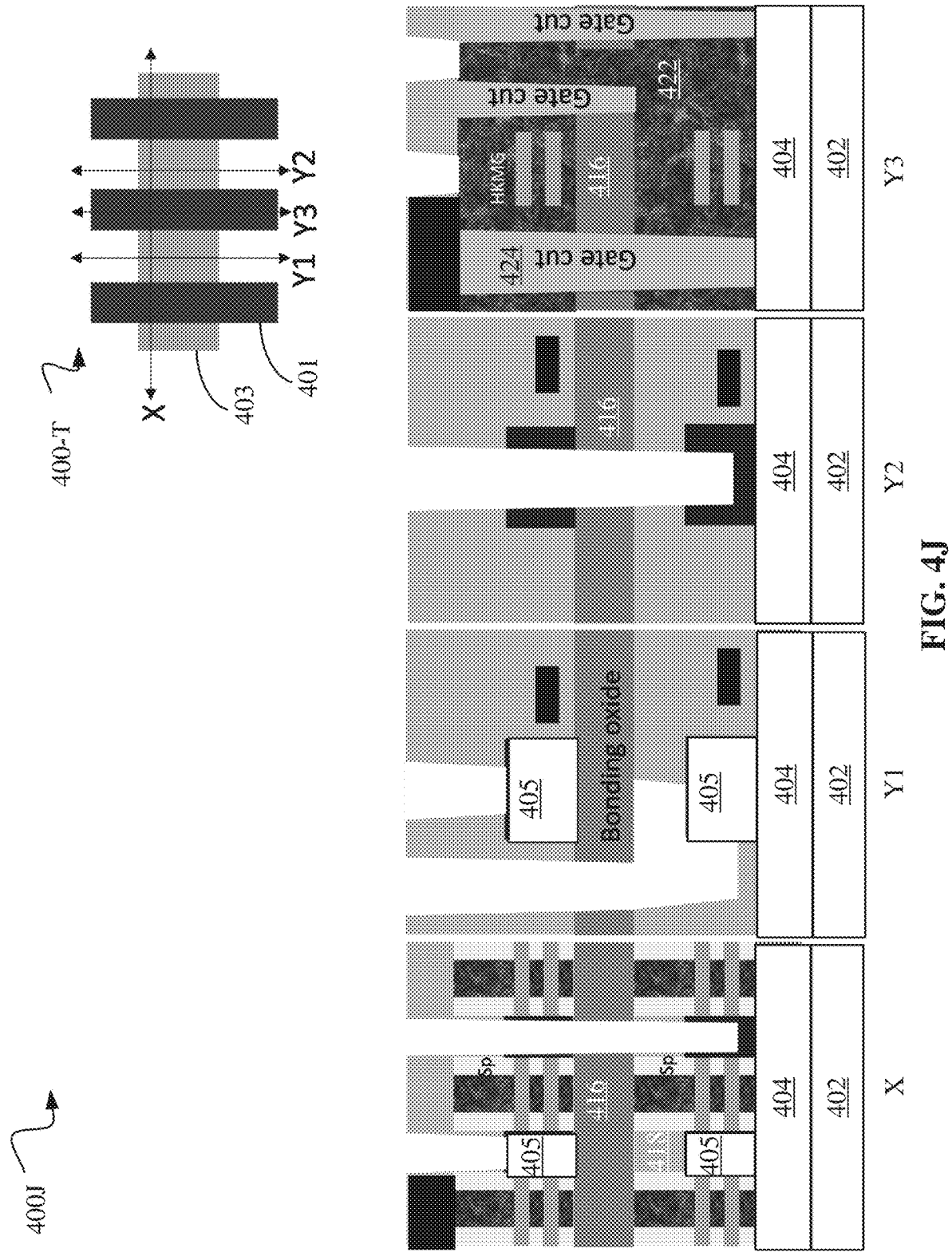

FIG. 4J is a block diagram of an example fabrication state 400J of stacked FET with three-terminal SOT MRAM, in accordance with some embodiments of the present disclosure. The example fabrication state 400J can result from operation 322. In comparison to example fabrication state 400I, the views X, Y2, and Y3 are unchanged. However, the view Y1 shows an opening in place of the bottom S/D sacrificial contact 420. In this way, the example fabrication state 400J represents the result of operation 322.

Referring back to FIG. 3B, at operation 324, the stacked FET with three-terminal SOT MRAM fabrication manager 150 can direct the fabrication tool to form contact metallization. Forming contact metallization can involve depositing metallic material to create electrically conductive contacts with the S/D epis 205.

Figure 4K:
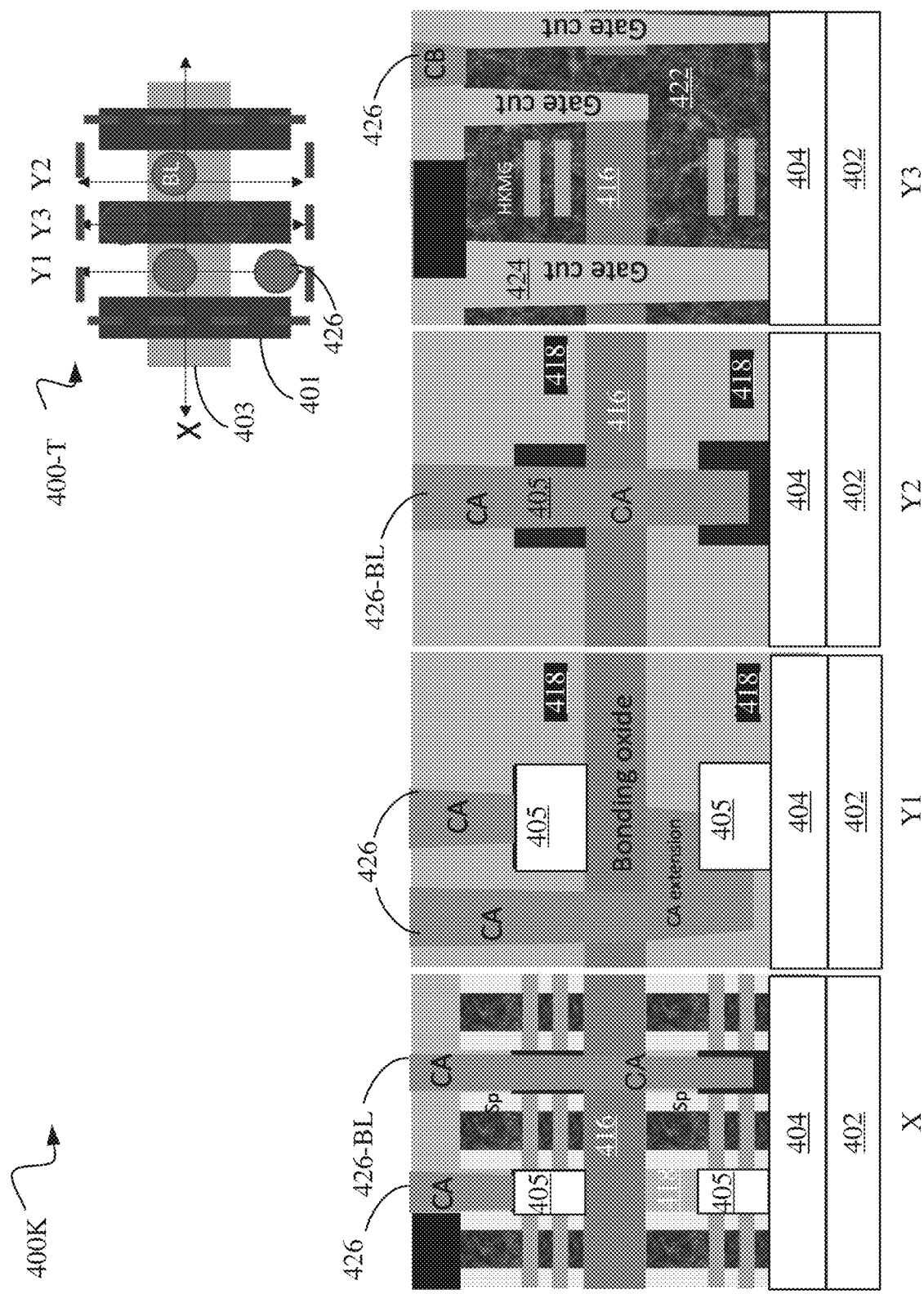

FIG. 4K is a block diagram of an example fabrication state 400K of stacked FET with three-terminal SOT MRAM, in accordance with some embodiments of the present disclosure. The example fabrication state 400K can result from operation 324. As shown in the top view 400-T, three-terminal SOT MRAM includes contacts 426 along the cut lines Y1, Y3, and Y2. Additionally, the contact 426 along cut line Y2 is represented as a bit line (BL) contact.

Further, views X, Y1, and Y2 shows the contacts 426, 426-BL in contact with S/D epis 405 in the top and bottom layers. Additionally, view Y3 shows the contact 426-BL in contact with an S/D epi 405 in the top layer. In this way, the example fabrication state 400K represents the result of operation 324.

Referring back to FIG. 3B, at operation 326, the stacked FET with three-terminal SOT MRAM fabrication manager 150 can direct the fabrication tool to form the back end of line (BEOL) connection. Forming the BEOL connection can involve depositing ILD 418 and connections from the word lines (e.g., WWL, RWL), bit line (BL), and SOT line (SL) to the contacts 426 for the S/D epis 405.

Figure 4L:
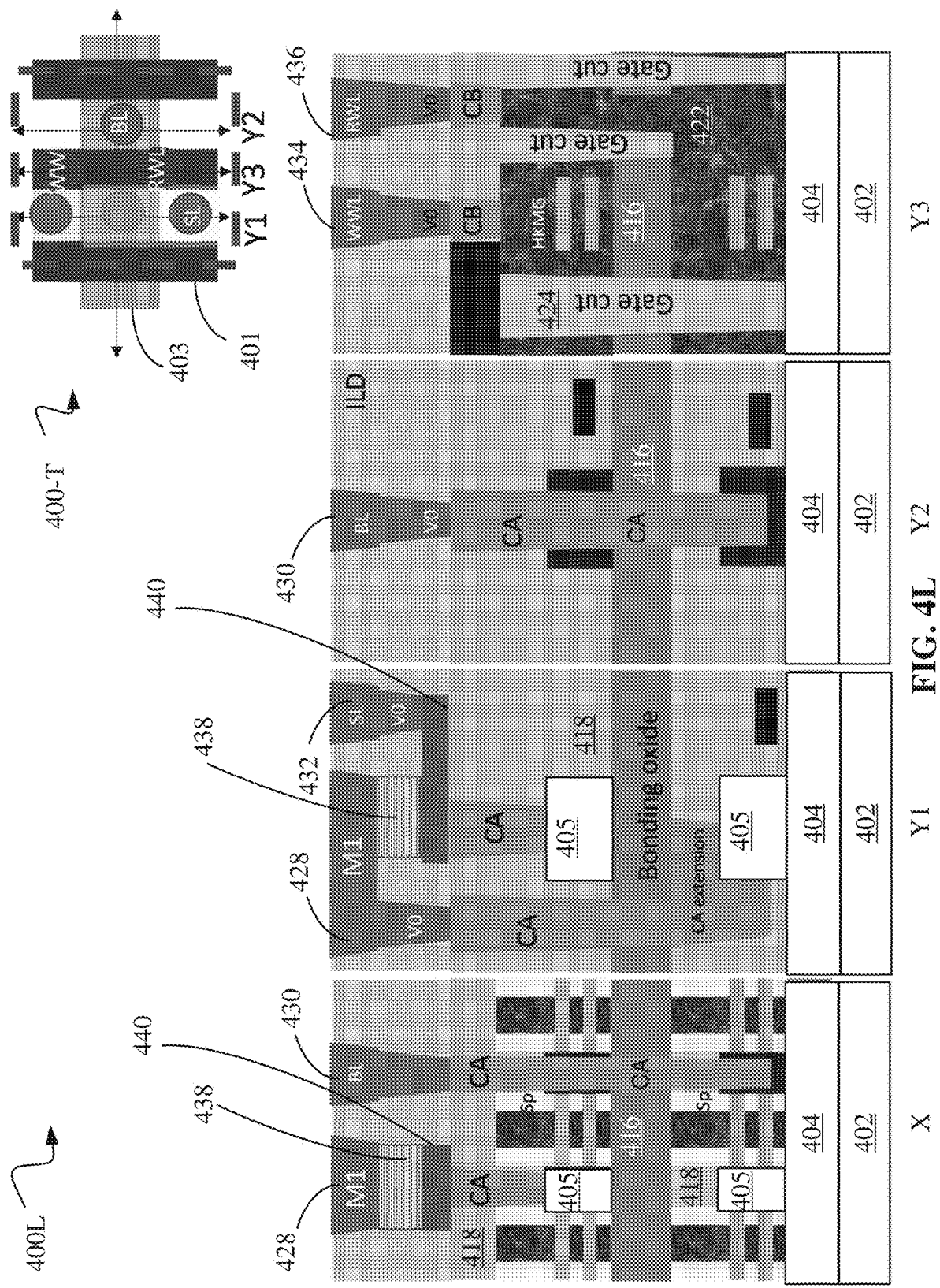

FIG. 4L is a block diagram of an example fabrication state 400L of stacked FET with three-terminal SOT MRAM, in accordance with some embodiments of the present disclosure. The example fabrication state 400L can result from operation 326. As shown in the top view 400-T, three-terminal SOT MRAM includes the WWL, RWL, BL, and SL.

Additionally, in comparison to example fabrication state 400K, the example fabrication state 400L shows the BEOL connections. Specifically, the views X, Y1, Y2, and Y3 show deposited ILD 418, metallic line M1 428, bit line 430, SOT line 432, WWL 434, RWL 436, MTJ 438, and heavy metal layer 440. The heavy metal layer 440 may have a relatively high SHE. In these ways, the example fabrication state 400L represents the result of operation 326.

A non-limiting list of examples are provided hereinafter to demonstrate some aspects of the present disclosure.

Example 1 is a three-terminal spin-orbit-torque (SOT) magnetoresistive random access memory (MRAM) device. The device includes a first type field effect transistor (FET) that drives an SOT line, wherein the first type FET comprises a write gate in electrical contact with a write wordline (WWL); and a second type FET in electrical contact with a magnetic tunnel junction (MTJ), wherein the second type FET comprises a read gate in electrical contact with a read wordline (RWL), wherein the first type FET is disposed above the second type FET, and wherein the three-terminal SOT MRAM device provides a density of three contacted poly pitch (CPP) per two cells.

Example 2 includes the device of example 1, including or excluding optional features. In this example, the first type FET comprises an n-type FET (NFET). Optionally, the second type FET comprises a p-type FET (PFET).

Example 3 includes the device of any one of examples 1 to 2, including or excluding optional features. In this example, the first type FET comprises a PFET. Optionally, the second type FET comprises an NFET.

Example 4 includes the device of any one of examples 1 to 3, including or excluding optional features. In this example, the device includes a substrate; and an isolation layer disposed between the second type FET and the substrate. Optionally, the isolation layer comprises a material selected from a group consisting of: a doped silicon (Si); an epitaxial doped Si; and a buried oxide.

Example 5 includes the device of any one of examples 1 to 4, including or excluding optional features. In this example, the device includes the SOT line, comprising a heavy metal; and the MTJ.

Example 6 is a three-terminal SOT MRAM device. The device includes an NFET that drives an SOT line, wherein the NFET comprises a write gate in electrical contact with a WWL; and a PFET in electrical contact with an MTJ, wherein the PFET comprises a read gate in electrical contact with an RWL, and wherein the PFET is disposed above the NFET.

Example 7 includes the device of example 6, including or excluding optional features. In this example, the three-terminal SOT MRAM device provides a density of 1.5 CPP per cell.

Example 8 includes the device of any one of examples 6 to 7, including or excluding optional features. In this example, the device includes a substrate; and an isolation layer disposed between the second type FET and the substrate. Optionally, the isolation layer comprises a material selected from a group consisting of: a doped silicon (Si); an epitaxial doped Si; and a buried oxide Example 9 is a three-terminal SOT MRAM device. The device includes a PFET that drives an SOT line, wherein the PFET comprises a write gate in electrical contact with a WWL; and an NFET in electrical contact with an MTJ, wherein the NFET comprises a read gate in electrical contact with an RWL, and wherein the NFET is disposed above the PFET. Optionally, the three-terminal SOT MRAM device provides a density of 1.5 CPP per cell. Optionally, the device includes a substrate; and an isolation layer disposed between the second type FET and the substrate. Optionally, the isolation layer comprises a material selected from a group consisting of: a doped silicon (Si); an epitaxial doped Si; and a buried oxide Example 10 is a method for fabricating a three-terminal SOT MRAM device, the method. The method includes forming a bottom dummy gate on an isolation layer in contact with a substrate; forming a bottom source/drain epitaxy (S/D epi); performing an interlayer dielectric (ILD) deposit on the dummy gate and bottom S/D epi; performing a chemical mechanical planarization to remove: a gate hard mask of the bottom dummy gate; and a plurality of spacers in contact with the gate hard mask; forming a bottom S/D sacrificial contact in contact with the bottom S/D epi; forming a bonding oxide disposed above a bottom layer comprising the bottom dummy gate; bonding the bonding oxide to a plurality of nanosheet channels of a top layer, wherein the top layer comprises a plurality of sacrificial nanosheet layers in contact with the plurality of nanosheet channels; performing active device patterning on the top layer; forming a top dummy gate of the top layer; forming a plurality of spacers for the top layer; forming a top S/D epi for the top layer; depositing ILD for the top layer; performing CMP to remove: a hard mask of the top layer; and a plurality of spacers of the top layer; forming a gate opening mask; removing the top dummy gate and the bottom dummy gate; performing an SiGe release; removing the plurality of sacrificial nanosheet layers; forming a replacement gate for the top layer and bottom layer; forming a plurality of gate cuts that provide access to the top S/D epi and the bottom S/D epi; forming a plurality of middle of line (MOL) contacts; removing the bottom S/D sacrificial contact; forming contact metallization using the plurality of gate cuts; and forming a plurality of back end of line (BEOL) connections. Optionally, the three-terminal SOT MRAM device provides a density of three contacted poly pitch (CPP) per two cells Example 11 includes the method of any one of examples 10 to 10, including or excluding optional features. In this example, forming the replacement gate for the top layer and bottom layer comprises: forming a bottom replacement gate for the removed bottom dummy gate; and forming a top replacement gate for the removed top dummy gate. Optionally, the bottom S/D epi comprises an n-type field effect transistor (NFET), and wherein the top S/D epi comprises a p-type field effect transistor (PFET). Optionally, the bottom S/D epi comprises a PFET, and wherein the top S/D epi comprises an NFET.

Example 12 is a computer program product comprising program instructions stored on a computer readable storage medium. The computer-readable medium includes instructions that direct the processor to forming a bottom dummy gate on an isolation layer in contact with a substrate; forming a bottom source/drain epitaxy (S/D epi); performing an interlayer dielectric (ILD) deposit on the dummy gate and bottom S/D epi; performing a chemical mechanical planarization to remove: a gate hard mask of the bottom dummy gate; and a plurality of spacers in contact with the gate hard mask; forming a bottom S/D sacrificial contact in contact with the bottom S/D epi; forming a bonding oxide disposed above a bottom layer comprising the bottom dummy gate; bonding the bonding oxide to a plurality of nanosheet channels of a top layer, wherein the top layer comprises a plurality of sacrificial nanosheet layers in contact with the plurality of nanosheet channels; performing active device patterning on the top layer; forming a top dummy gate of the top layer; forming a plurality of spacers for the top layer; forming a top S/D epi for the top layer; depositing ILD for the top layer; performing CMP to remove: a hard mask of the top layer; and a plurality of spacers of the top layer; forming a gate opening mask; removing the top dummy gate and the bottom dummy gate; performing an SiGe release; removing the plurality of sacrificial nanosheet layers; forming a replacement gate for the top layer and bottom layer; forming a plurality of gate cuts that provide access to the top S/D epi and the bottom S/D epi; forming a plurality of middle of line (MOL) contacts; removing the bottom S/D sacrificial contact; forming contact metallization using the plurality of gate cuts; and forming a plurality of back end of line (BEOL) connections. Optionally, the three-terminal SOT MRAM device provides a density of three contacted poly pitch (CPP) per two cells Example 13 includes the computer-readable medium of any one of examples 12 to 12, including or excluding optional features. In this example, forming the replacement gate for the top layer and bottom layer comprises: forming a bottom replacement gate for the removed bottom dummy gate; and forming a top replacement gate for the removed top dummy gate. Optionally, the bottom S/D epi comprises an n-type field effect transistor (NFET), and wherein the top S/D epi comprises a p-type field effect transistor (PFET). Optionally, the bottom S/D epi comprises a PFET, and wherein the top S/D epi comprises an NFET.

What is claimed is:

1. A three-terminal spin-orbit-torque (SOT) magnetoresistive random access memory (MRAM) device, comprising:
    a first type field effect transistor (FET) that drives an SOT line, wherein the first type FET comprises a write gate in electrical contact with a write wordline (WWL); and
    a second type FET in electrical contact with a magnetic tunnel junction (MTJ), wherein the second type FET comprises a read gate in electrical contact with a read wordline (RWL), wherein the first type FET is disposed above the second type FET, and wherein the three-terminal SOT MRAM device provides a density of three contacted poly pitch (CPP) per two cells.

2. The three-terminal SOT MRAM device of claim 1, wherein the first type FET comprises an n-type FET (NFET).

3. The three-terminal SOT MRAM device of claim 2, wherein the second type FET comprises a p-type FET (PFET).

4. The three-terminal SOT MRAM device of claim 1, wherein the first type FET comprises a PFET.

5. The three-terminal SOT MRAM device of claim 4, wherein the second type FET comprises an NFET.

6. The three-terminal SOT MRAM device of claim 1, further comprising:
    a substrate; and
    an isolation layer disposed between the second type FET and the substrate.

7. The three-terminal SOT MRAM device of claim 6, wherein the isolation layer comprises a material selected from a group consisting of:
a doped silicon (Si);
an epitaxial doped Si; and
a buried oxide.

8. The three-terminal SOT MRAM device of claim 1, further comprising:
the SOT line, comprising a heavy metal; and
the MTJ.

9. A three-terminal SOT MRAM device, comprising:
an NFET that drives an SOT line, wherein the NFET comprises a write gate in electrical contact with a WWL; and
a PFET in electrical contact with an MTJ, wherein the PFET comprises a read gate in electrical contact with an RWL, and wherein the PFET is disposed above the NFET.

10. The three-terminal SOT MRAM device of claim 9, wherein the three-terminal SOT MRAM device provides a density of 1.5 CPP per cell.

11. The three-terminal SOT MRAM device of claim 9, further comprising:
a substrate; and
an isolation layer disposed between the NFET and the substrate.

12. The three-terminal SOT MRAM device of claim 11, wherein the isolation layer comprises a material selected from a group consisting of:
a doped silicon (Si);
an epitaxial doped Si; and
a buried oxide.

13. A three-terminal SOT MRAM device, comprising:
a PFET that drives an SOT line, wherein the PFET comprises a write gate in electrical contact with a WWL; and
an NFET in electrical contact with an MTJ, wherein the NFET comprises a read gate in electrical contact with an RWL, and wherein the NFET is disposed above the PFET, wherein the three-terminal SOT MRAM device provides a density of 1.5 CPP per cell.

14. The three-terminal SOT MRAM device of claim 13, further comprising:
a substrate; and
an isolation layer disposed between the PFET and the substrate.

15. The three-terminal SOT MRAM device of claim 14, wherein the isolation layer comprises a material selected from a group consisting of:
a doped silicon (Si);
an epitaxial doped Si; and
a buried oxide.

16. The three-terminal SOT MRAM device of claim 1, further comprising:
a bonding dielectric; and
a gate cut region, wherein the bonding dielectric and the gate cut region separate the write gate from the read gate.

17. The three-terminal SOT MRAM device of claim 1, wherein the first type FET comprises a plurality of top nanosheet channels, wherein the second type FET comprise a plurality of bottom nanosheet channels, and wherein the plurality of top nanosheet channels are inline with the plurality of bottom nanosheet channels.

18. The three-terminal SOT MRAM device of claim 1, wherein SOT line, the WWL, and the RWL are in a same metal level.

19. The three-terminal SOT MRAM device of claim 9, further comprising a heavy metal layer electrically connected to the SOT line and electrically connected to the MTJ.

20. The three-terminal SOT MRAM device of claim 13, further comprising a heavy metal layer electrically connected to the SOT line and electrically connected to the MTJ.

* * * * *